(12) United States Patent
Ionescu et al.

(10) Patent No.: US 11,242,258 B1
(45) Date of Patent: Feb. 8, 2022

(54) METHOD OF MANUFACTURE OF POROUS SILICON

(71) Applicant: ionobell Inc, San Jose, CA (US)

(72) Inventors: Robert C. Ionescu, San Jose, CA (US); Chueh Liu, San Jose, CA (US)

(73) Assignee: ionobell Inc., San Jose, CA (US)

( * ) Notice: Subject to any disclaimer, the term of this patent is extended or adjusted under 35 U.S.C. 154(b) by 0 days.

(21) Appl. No.: 17/097,774

(22) Filed: Nov. 13, 2020

(51) Int. Cl.
*C01B 33/023* (2006.01)
*C01B 33/18* (2006.01)
*C23C 16/26* (2006.01)
*B82Y 40/00* (2011.01)
*B82Y 30/00* (2011.01)

(52) U.S. Cl.
CPC ............ *C01B 33/182* (2013.01); *C23C 16/26* (2013.01); *B82Y 30/00* (2013.01); *B82Y 40/00* (2013.01); *C01P 2004/51* (2013.01); *C01P 2004/64* (2013.01); *C01P 2006/16* (2013.01); *C01P 2006/40* (2013.01)

(58) Field of Classification Search
CPC ........ H01M 4/525; H01M 4/134; H01M 4/38; H01M 4/62; H01M 4/505; H01M 4/36; H01M 4/02; H01M 4/386; H01M 4/366; H01M 4/622; H01M 4/625; H01M 4/362; H01M 10/052; H01M 10/42; H01M 10/0525; H01M 10/0569; C01B 33/00; C01B 33/023; C01B 33/182; C01P 2004/32; C01P 2004/64; C01P 2004/84; C01P 2004/51; C01P 2006/12; C01P 2006/40; C23C 16/26; B82Y 40/00; B82Y 30/00

See application file for complete search history.

(56) References Cited

U.S. PATENT DOCUMENTS

| | | | |
|---|---|---|---|
| 9,765,271 B2 * | 9/2017 | Myrick | C06B 33/06 |
| 10,756,330 B2 | 8/2020 | Wang et al. | |
| 2016/0308205 A1 * | 10/2016 | Canham | H01M 4/386 |
| 2017/0194631 A1 * | 7/2017 | Favors | H01M 4/364 |
| 2019/0326593 A1 | 10/2019 | Ozkan et al. | |

OTHER PUBLICATIONS

Yan (NPL: "Silicon Li-ion Anode Materials via Spray Drying and Magnesiothermic Reduction", published on Jun. 2019, Chemical and Environmental Engineering, pp. 1-106).*
Ball, Philip, "Silicon seduced from silica: Synthetic silicon could be cheaper and more delicate" Nature, May 19, 2003, 2 pages.
Campbell, Brennan et al. "Carbon-Coated, Diatomite-Derived Nanosilicon as a High Rate Capable Li-ion Battery Anode", Scientifc Reports, 6: 33050, 9 pages.

(Continued)

*Primary Examiner* — Smita S Patel
(74) *Attorney, Agent, or Firm* — Jeffrey Schox; Diana Lin

(57) ABSTRACT

A method for manufacturing porous silicon can include reducing unpurified silica in the presence of a reducing agent to prepare a porous silicon material. The method of manufacture can optionally include purifying a silica, exposing the silica to reaction modifiers, purifying the mixture of the silica and reaction modifiers, comminuting the silica, purifying the silicon, coating the silicon, post-processing the silicon, and/or any suitable steps.

9 Claims, 13 Drawing Sheets

(56) References Cited

OTHER PUBLICATIONS

Dai, Fang et al. "Minimized Volume Expansion in Hierarchical Porous Silicon upon Lithiation", ACS Appl. Mater. Interfaces 2019, 11, pp. 13257-13263.
Darghouth, A. et al. "High Purity Porous Silicon Powder Synthesis by Magnesiothermic Reuction of Tunisina Silica Sand", Silicon, Research Gate, Apr. 2020, 11 pages.
Evonik, Aerosil—Fumed Silica—Technical Overview, 104 pages.
Favors, Zachary "Scalable Synthesis of Nano-Silicon from Beach San for Long Cycle Life Li-ion Batteries" Scientific Reports, 4: 5623, 7 pages.
Favors, Zachary et al. Towards Scalable Binderless Electrodes: Carbon Coated Silicon Nanofiber Paper via Mg Reduction of Electrospun SiO2 Nanofibers, Scientifc Reports, 5: 8246, 7 pages.
Jia, Haiping et al., "A novel approach to synthesize micrometer-sized porous silicon as a high performance anode for lithium-ion batteries" Nano Energy 50 (2018) pp. 589-597.
Li, Changling et al. "Silicon Derived from Glass Bottles as Anode Materials for Lithium Ion Full Cell Batteries", Scientific Reports, 7:917, 11 pages.
Wang, Wei et al. "Monodisperse Porou Silicon Spheres as Anode Materials for Lithium Ion Batteries" Scientific Reports, 5: 8781 6 pages.
Wikipedia definition for Porous Silicon, 8 pages.
Zhang, Tianwen "Porous silicon nano-aggregate from silica fume as an anode for high energy lithium-ion batteries" RSC Adv. 2016, 6, 30577-30581.

\* cited by examiner

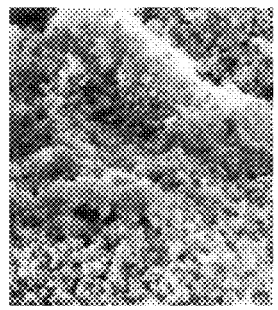
Figure 3A
Figure 3B
Figure 3C
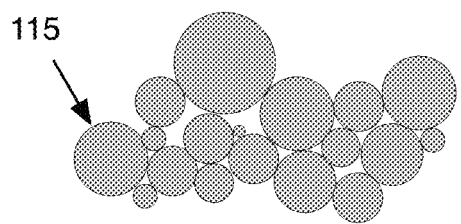
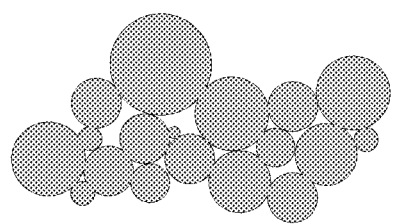
Figure 4A
Figure 4B
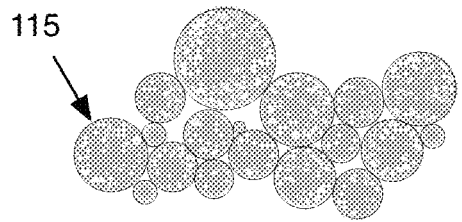
Figure 4C

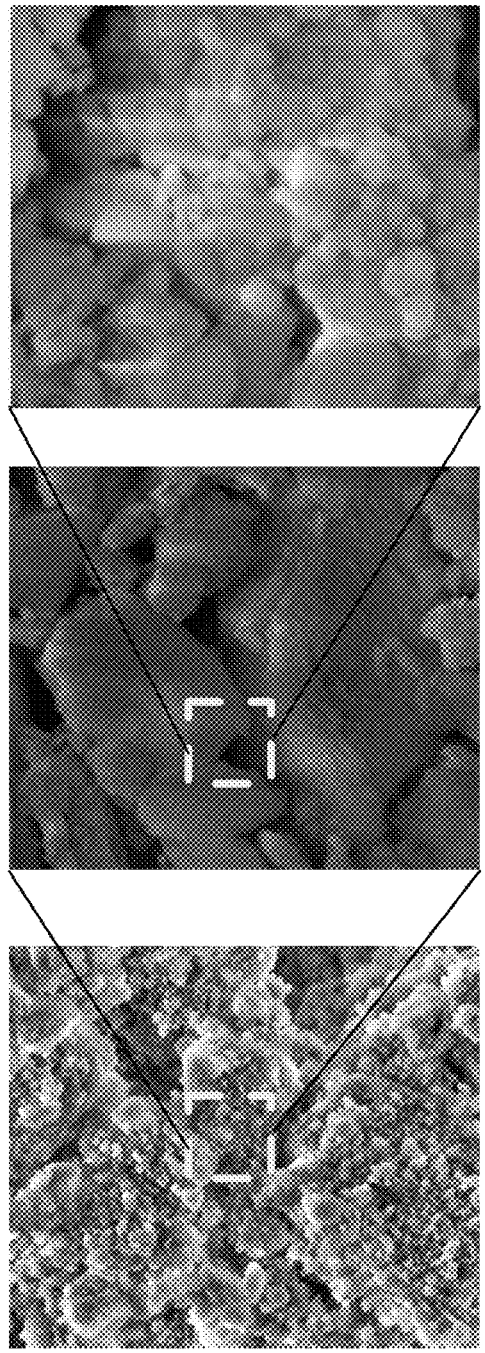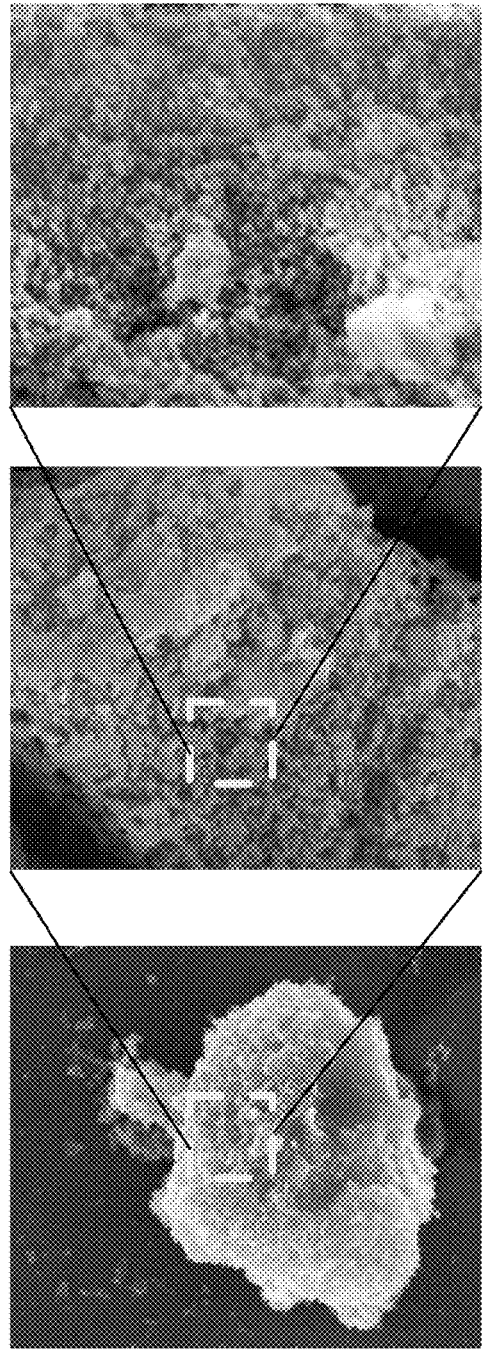
Figure 16A                              Figure 16B

METHOD OF MANUFACTURE OF POROUS SILICON

TECHNICAL FIELD

This invention relates generally to the silicon field, and more specifically to a new and useful system and method in the silicon field.

BACKGROUND

Silicon's (Si) high specific capacity makes it an attractive battery electrode material. However, the large volume expansion and reactivity remain obstacles to developing Si electrodes. Porous silicon may overcome some of the existing challenges with using Si in the electrodes. Thus, there is a need in the silicon field for new and useful system and method. This invention provides such a new and useful system and method.

BRIEF DESCRIPTION OF THE FIGURES

FIGS. 3A, 3B, and 3C are top down scanning electron micrographs of examples of the silicon material.

FIG. 4A is a schematic representation of an example of a silicon material including freestanding particles forming a cluster.

FIG. 4B is a schematic representation of an example of a silicon material including interconnected particles forming a cluster.

FIG. 4C is a schematic representation of an example of a silicon material including porous particles.

FIGS. 16A and 16B are top down scanning electron micrographs of examples of silica gel starting materials and resulting silicon materials, respectively.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview

Figure 1:
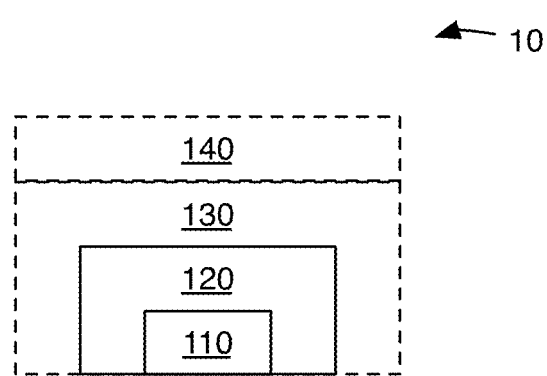
FIG. 1 is a schematic representation of the system.

As shown in FIG. 1, the silicon material 10 can include a primary structural characteristic 110 and a secondary structural characteristic 120. The silicon material can optionally include a tertiary structural characteristic 130, one or more coatings 140, and/or any suitable components.

Figure 2:
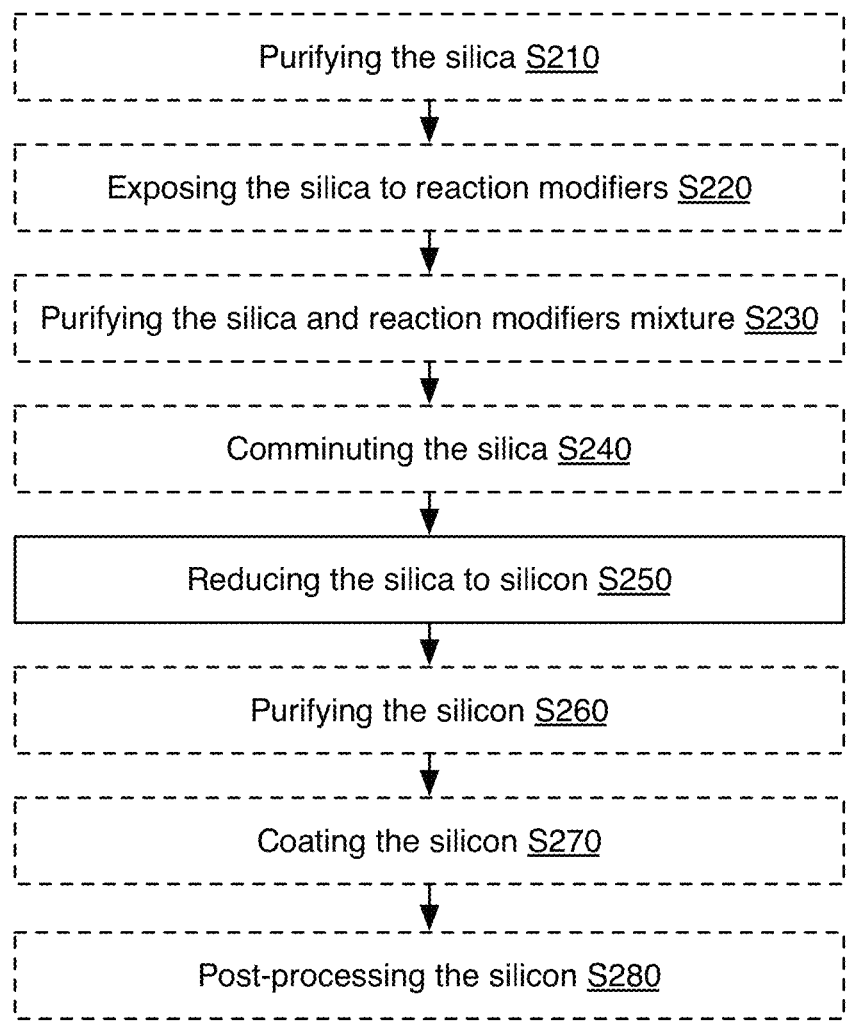
FIG. 2 is a schematic representation of the method.

As shown in FIG. 2, a method 20 for manufacturing a silicon material can include reducing the silica to silicon S250. The method of manufacture can optionally include purifying the silica S210, exposing the silica to reaction modifiers S220, purifying the mixture of silica and reaction modifier(s) S230, comminuting the silica S240, purifying the silicon S260, coating the silicon S270, post-processing the silicon S280, and/or any suitable steps.

Figure 5:
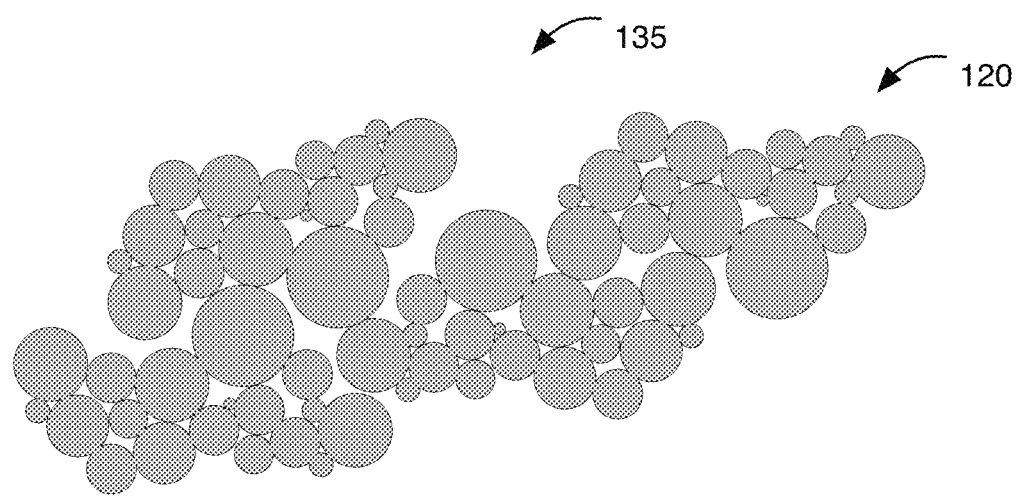
FIG. 5 is a schematic representation of an example of a silicon material including clusters coming together to form agglomers.

In an illustrative example as shown in FIG. 5, the primary structural characteristic can correspond to a plurality of nanoparticles; the secondary structural characteristic can correspond to a plurality of clusters, each cluster including a set of nanoparticles; and the tertiary structural characteristic can correspond to a plurality of agglomers, each agglomer including a set of clusters.

Figure 8A:
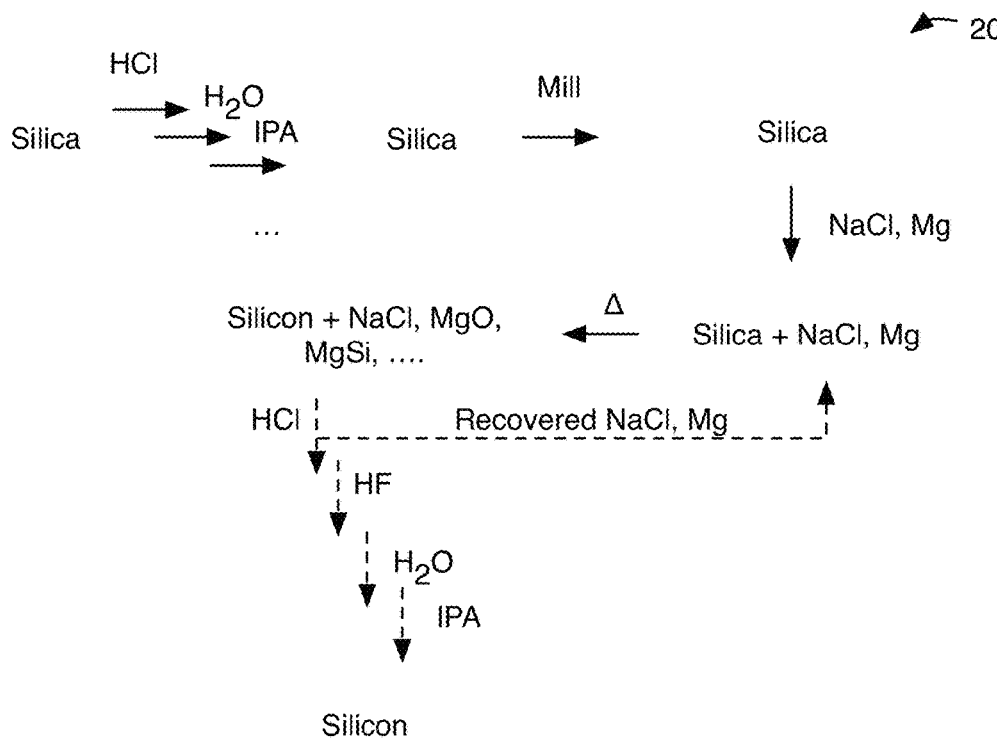
FIGS. 8A and 8B are schematic representations of examples of a method of manufacturing the silicon material.
Figure 8B:
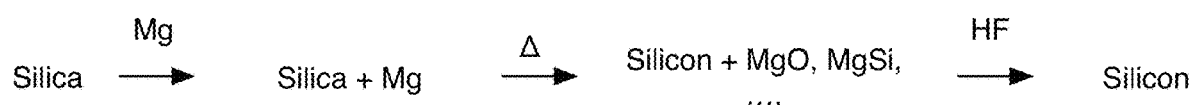

In a first illustrative example, as shown in FIG. 8B, the method for manufacturing the silicon material can include exposing a silica starting material (e.g., silicon precursor, silica precursor, unpurified silica, purified silica, etc.) such as fumed silica to a reducing agent (e.g., Mg), reducing the silica starting material to silicon, and, optionally, washing the resultant silicon with a wash solution (e.g., an acidic solution, such as HF) to remove one or more reaction byproducts (e.g., MgO, MgSi, etc.). In this illustrative example, the silica is reduced to silicon by heating the silica and Mg to a reducing temperature (e.g., between 300-900° C.). This illustrative example can include coating (and/or loading) the silicon, for example with a carbonaceous coating such as using CVD, by carbonizing a polymer, and/or otherwise adding a conductive additive to the silicon.

In a second illustrative example, as shown in FIG. 8A, the method for manufacturing the silicon material can include washing the silica (e.g., using an acidic solution such as HCl; using solvents such as water, isopropyl alcohol, ethanol, etc.; etc.); milling the silica; exposing the silica to salt (e.g., NaCl) and a reducing agent (e.g., Mg); heating the silica, salt, and reducing agent to reduce the silica to silicon; and washing the resulting silicon (e.g., using an acidic solution such as HCl, HF, etc.; using a solvent such as water, IPA, acetone, etc.; etc.). In this illustrative example, the salt and reducing agent can be exposed to the silica at the same time (e.g., contemporaneously), the silica can be exposed to the salt before exposure to the reducing agent, and/or the silica can be exposed to the reducing agent before the salt. In this illustrative example, the salt can coat the silica and/or the salt can be intermixed with the silica. This illustrative example can include coating the silicon for example using CVD, polymers, and/or otherwise coating the silicon.

The silicon material is preferably used as an anode material (e.g., an anode slurry) in a battery (e.g., a Li-ion battery). However, the silicon material can additionally or alternatively be used as an absorbent material (e.g., for oil and oil-based media absorption such as to separate oil from water.), for photovoltaic applications (e.g., as a light absorber, as a charge separator, as a free carrier extractor, etc.), a thermal insulator (e.g., a thermal insulator that is operable under extreme conditions such as high temperatures, high pressures, ionizing environments, low temperatures, low pressures, etc.), for high sensitivity sensors (e.g., high gain, low noise, etc.), radar absorbing material, insulation (e.g., in buildings, windows, thermal loss and solar systems, etc.), for biomedical applications, for pharmaceutical applications (e.g., drug delivery), aerogels (e.g., silicon aerogels), and/or for any suitable application. For some of these applications, including but not limited to the pharmaceutical applications, the resulting silicon material could be oxidized into silica (e.g., $SiO_2$ that retains a morphology substantially identical to that of the silicon material) and/or used as silicon. The silicon can be oxidized, for example, by heating the silicon material (e.g., in an open environment, in an environment with a controlled oxygen content, etc.) to between 200 and 1000° C. for 1-24 hours. However, the silicon could be oxidized using an oxidizing agent and/or otherwise be oxidized.

2. Benefits

Variations of the technology can confer several benefits and/or advantages.

First, variants of the technology can be used as an anode in batteries to improve the storage and transport of energy and/or to decrease the weight of the battery (e.g., with the same or similar properties as compared to a battery that does not include the silicon material). In specific examples, this benefit is enabled by the porous matrix which enables the silicon to expand internally, as opposed to expanding externally. By expanding internally, this silicon material provides the additional benefit of not breaking or damaging the solid electrolyte layer (SEI) layer between the Si anode and the battery.

Second, variants of the technology can enable "green chemistry" approaches to the generation of the silicon materials. In specific examples, the process for manufacturing the silicon material can reuse waste materials (e.g., used silica, used salts, used reducing agents, etc.) thereby reducing the amount of waste used and/or generated.

Third, variants of the technology can use waste material from other processes, thereby decreasing overall material and manufacturing cost.

However, variants of the technology can confer any other suitable benefits and/or advantages.

As used herein, "substantially" or other words of approximation can be within a predetermined error threshold or tolerance of a metric, component, or other reference (e.g., within 0.001%, 0.01%, 0.1%, 1%, 5%, 10%, 20%, 30%, etc. of a reference), or be otherwise interpreted.

3. Silicon Material

The silicon material 10 can include a primary structural characteristic 110 and a secondary structural characteristic 120. The silicon material can optionally include a tertiary structural characteristic 130, one or more coating 140, and/or any suitable components. The silicon material can be provided as a powder, dust, slurry, colloid, suspension, solution, dispersion, and/or in any suitable form (e.g., in one or more steps of the process).

The silicon material is preferably characterized by material characteristics. However, the silicon material can additionally or alternatively be characterized by structural characteristics, and/or other properties. The characteristics can be measured (e.g., adsorption measurements, crystallography, etc.), inferred (e.g., based on images such as transmission electron micrograph images, scanning electron micrograph images, etc.), calculated, modelled, and/or otherwise be determined. The characteristics can be inherent properties (e.g., intrinsic properties, a result of the structure, a result of the materials present within the material, result from the process of manufacturing the silicon material, etc.) and/or extrinsic properties. Examples of material characteristics include: porosity, pore size, pore size distribution, surface area, tortuosity, crystallinity, elemental composition, expansion (e.g., internal expansion, external expansion, etc.), mass, volume, conductivity (e.g., electrical conductivity, thermal conductivity, etc.), mechanical properties (e.g., Young's modulus), morphology (e.g., branching, stacking, etc.), and/or any suitable material characteristics.

The porosity (e.g., void fraction such as the fraction or percentage of the volume that voids occupy within the material) of the silicon material can function to provide space for the silicon to expand within. The pores are preferably gaps or spaces between primary structural characteristics, but can additionally or alternatively be gaps or spaces between primary and secondary structural characteristics, between secondary structural characteristics, between primary and tertiary structural characteristics, between secondary and tertiary structural characteristics, between tertiary characteristics, within primary structural characteristics, and/or other structural features of the silicon material.

The porosity of the silicon material is preferably between about 25 and about 99.99%, such as 30%, 35%, 40%, 45%, 50%, 55%, 60%, 65%, 70%, 75%, 80%, 85%, 90%, 95%, 97.5%, 98%, 99%, 99.5%, 99.9%, be between a range thereof, be less than 25%, be greater than 99.99%, and/or be any suitable porosity. The pore volume of the silicon material is preferably between about 0.01 and 5 $cm^3$ $g^{-1}$ (e.g., 0.02, 0.05, 0.07, 0.1, 0.2, 0.5, 0.7, 1, 2 $cm^3$ $g^{-1}$, etc.), but can be less than 0.01 $cm^3$ $g^{-1}$ or greater than 5 $cm^3$ $g^{-1}$.

The pores can be nanopores, mesopores, micropores, and/or macropores. The pore size of the silicon material is preferably a value and/or range between about 0.1 nm and about 5 μm, such as 0.2 nm, 0.5 nm, 1 nm, 2 nm, 5 nm, 10 nm, 20 nm, 25 nm, 30 nm, 40 nm, 50 nm, 75 nm, 100 nm, 150 nm, 200 nm, 300 nm, 400 nm, 500 nm, 750 nm, 1 μm, 1.5 μm, 2 μm, 3 μm, 4 μm, and/or 5 μm. However, the pore size can be within a range above or below those values, be less than 1 nm or greater than 1 μm, and/or otherwise sized. The pore size is preferably distributed on a pore size distribution. However, the pore size can additionally or alternatively be substantially uniform (e.g., all pores are within ±1%, ±2%, ±5%, +10%, ±20%, +30%, etc. of a common pore size), the pore size can vary throughout the sample (e.g., engineered pore size gradient, accidental pore size variations, etc.), and/or the silicon material can have any suitable pore size.

The pore size distribution can be monomodal or unimodal, bimodal, polymodal, and/or have any suitable number of modes. In specific examples, the pore size distribution can be represented by (e.g., approximated as) a gaussian distribution, a Lorentzian distribution, a Voigt distribution, a uniform distribution, a mollified uniform distribution, a triangle distribution, a Weibull distribution, power law distribution, log-normal distribution, log-hyperbolic distribution, skew log-Laplace distribution, asymmetric distribution, skewed distribution, and/or any suitable distribution.

In some variants, the silicon material can have a plurality of pore sizes and/or pore size distributions. In an illustrative example, the silicon material can include a first pore size distribution that can include pores that are approximately 1-100 nm (e.g., corresponding to gaps generated between primary structural characteristics) and a second pore size distribution that can include pores that are approximately 0.1 to 5 µm (e.g., corresponding to gaps generated between secondary structural characteristics). In an illustrative example, the primary structures can cooperatively form pores within the secondary structures. In a variant of the illustrative example, the primary structure can cooperatively form primary pores within the secondary structures and the secondary structures can cooperatively form secondary pores within the tertiary structure. In a second illustrative example, the primary structures can include primary pores and can cooperatively form secondary pores within the secondary particles. However, the silicon material can have any suitable pores and/or pore distribution.

The pore distribution throughout the silicon material can be: substantially uniform, random, engineered (e.g., form a gradient along one or more axes), or otherwise configured. The distribution of pore sizes throughout the silicon material can be: uniform, random, engineered (e.g., form a gradient along one or more axes), or otherwise configured.

The surface area (e.g., exposed surface area such as contactable with an external environment, external of the pores, inclusive of the pore area, etc.) is preferably between about 0.01 to 1500 m$^2$/g (e.g., 0.1 m$^2$/g, 0.5 m$^2$/g, 1 m$^2$/g, 2 m$^2$/g, 3 m$^2$/g, 5 m$^2$/g, 10 m$^2$/g, 15 m$^2$/g, 20 m$^2$/g, 25 m$^2$/g, 30 m$^2$/g, 50 m$^2$/g, 75 m$^2$/g, 100 m$^2$/g, 110 m$^2$/g, 125 m$^2$/g, 150 m$^2$/g, 175 m$^2$/g, 200 m$^2$/g, 300 m$^2$/g, 400 m$^2$/g, 500 m$^2$/g, 750 m$^2$/g, 1000 m$^2$/g, 1250 m$^2$/g, 1400 m$^2$/g, between a range thereof, etc.). However, the surface area can be above or below the values above, or be less than 0.01 m$^2$/g and/or greater than 1500 m$^2$/g. In some variants, the surface area can refer to a Brunner-Emmett-Teller (BET) surface area. However, any definition, theory, and/or measurement of surface area can be used.

The tortuosity of the silicon material is preferably substantially isotropic (e.g., the tortuosity is the same to within 1%, 5%, 10%, 20%, 30%, etc. along different directions). However, the tortuosity can be substantially isotropic in a plane (e.g., tortuosity along two reference axes are substantially the same and different about a third reference axis), radially isotropic, anisotropic, and/or have any directionality. The tortuosity can be defined as and/or estimated from: arc-chord ratio, arc-chord ratio divided by a number of inflection points and/or an integral of square of curvature, divided by a curve length; Euclidean distance sums of the centroids of a pore divided by the length of the pore; and/or otherwise be defined. The tortuosity can depend on the shape (e.g., primary structural characteristics, secondary structural characteristics, tertiary structural characteristics, etc.), porosity, and/or any other properties of the silicon material. The tortuosity (e.g., along one or more reference axes) is preferably greater than 1, such as 2, 3, 4, 5, 7.5, 8, 8.6, 10. However, the tortuosity can be less than 1 or greater than 10.

The silicon material (and/or each primary, secondary, and/or tertiary structural unit thereof) can include amorphous silicon, polycrystalline silicon, and/or monocrystalline silicon. However, the silicon material can have any suitable crystallinity.

The elemental composition of the silicon material is preferably at least 60% silicon. For example, the elemental composition of the silicon material can be 65%, 70%, 75%, 80%, 85%, 90%, 91%, 92%, 93%, 94%, 95%, 96%, 97%, 98%, 99%, 99.5%, 99.9%, 99.99%, and/or 99.999% silicon, a range defined therebetween, more, less, or otherwise related to the aforementioned values. However, the silicon material can have less than 60% silicon or greater than 99.999% silicon. The remainder of the elemental composition can include one or more of: alkali metals (e.g., Li, Na, K, Rb, Cs, Fr), alkaline earth metals (e.g., Be, Mg, Ca, Sr, Ba, Ra), transition metals (Sc, Ti, V, Cr, Mn, Fe, Co, Ni, Cu, Y, Zr, Nd, Mo, Tc, Ru, Rh, Pd, Ag, Hf, Ta, W, Re, Os, Ir, Pt, Au), post-transition metals (e.g., Al, Ga, In, Tl, Sn, Pb, Bi, Po, At, Zn, Cd, Hg), metalloids (e.g., B, Ge, As, Sb, Te), nonmetals (e.g., H, N, P, O, S, Se, F, Cl, Br, I, He, Ne, Ar, Kr, Xe, Rn), lanthanides (e.g., Ce, Pr, d, Pm, Sm, Eu, Gd, Tb, Dy, Ho, Er, Tm, Yb, Lu), actinides (e.g., Th, Pa, U, Np, Pu, Am, Cm, Bk, Cf, Es, Fm, Md, No, Lr), and/or any suitable combinations thereof. The remainder can be uniformly or nonuniformly distributed through the silicon material.

In a first illustrative example, the silicon material can include up to about 40% oxygen (e.g., by mass, by volume, by stoichiometry, etc.) such as between about 3-37%. In this illustrative example, the oxygen can be incorporated as silicon oxide (SiO$_x$ for $0 \leq x \leq 2$), such as unreacted SiOx, an SiOx coating around a core of Si, and/or otherwise be incorporated.

In a second illustrative example, particularly but not exclusively relating to coated silicon materials, the silicon material can include carbon. In the second illustrative example, the carbon to silicon ratio (e.g., stoichiometric ratio, mass ratio, volume ratio, etc.) is preferably approximately 1 to 9. However, the carbon to silicon ratio can be 10:1, 5:1, 2:1, 1:1, 1:2, 1:3, 1:4, 1:5, 1:7, 1:8, 1:9, 1:10, 1:20, 1:50, 1:100, and/or be any suitable ratio. In variants of the second illustrative example, the carbon content can refer to a content of organic material (e.g., polymers). The carbon content can coat the primary structures, the secondary structures, the tertiary structures, fill a portion of the pore volume, remain substantially outside the pores, enter the silicon matrix (e.g., form an alloy or silicon carbide), and/or be otherwise arranged. However, the carbon content can refer to inorganic carbon content and/or combined organic and inorganic content.

In a third illustrative example, the silicon materials can include lithium. In the third illustrative example, the lithium to silicon ratio (e.g., stoichiometric ratio, mass ratio, volume ratio, etc.) can be 15:4, 3:1, 2:1, 1:1, 1:2, 1:3, 1:5, 1:10, 1:100, 1:1000, 1:10000, and/or be any ratio.

In some variants of the invention, specific elements (e.g., chemical elements, impurities) can be added to identify the silicon material, for instance to be used as a means of tracing a manufacturing site, lot number, and/or to be otherwise used. In these variants, the elements to be added are preferably below an amount that will introduce changes to the material properties or characteristics of the silicon material. However, additionally or alternatively, the identifier element(s) can be added in an amount that will introduce changes to the material properties or characteristics (e.g., change a color of the material, pore shape, primary structure, secondary structure, tertiary structure, refraction, etc.).

The expansion of the silicon material preferably refers to a volumetric expansion, but can additionally or alternatively refer to a dimensional expansion (e.g., expansion along one or more axes of the silicon material), and/or to any suitable expansion of the silicon material. The volumetric expansion can include inward volumetric expansion (e.g., to fill void space within the material such as to fill pores), external volume expansion (e.g., expanding into an environment proximal the material), combinations thereof, and/or any suitable volumetric expansion. Examples of expansion include: thermal expansion, swelling (e.g., expansion due to absorption of solvent or electrolyte), atomic or ionic displacement, atomic or ionic intercalation (e.g., metalation, lithiation, sodiation, potassiation, etc.), electrostatic effects (e.g., electrostatic repulsion, electrostatic attraction, etc.), and/or any suitable expansion source. The expansion is preferably less than a critical expansion, because when the expansion (e.g., external expansion) exceeds the critical expansion, the silicon material, a coating thereof, an SEI layer, and/or other system or application component can break or crack.

The expansion can be a percentage change (e.g., relative to the unexpanded material, relative to maximal or minimal material parameters, etc.), an absolute change (e.g., an absolute volume change, an absolute dimension change, etc.), and/or be otherwise represented. A negative expansion can correspond to contraction of the material while a positive expansion can correspond to expansion of the material. However, negative or positive expansion can be otherwise defined.

The expansion can correspond to expansion of the primary, secondary, and/or tertiary structural characteristics. The expansion is preferably different for the primary structural characteristics than the secondary and/or tertiary structural characteristics, but can be the same and/or the structural characteristics can expand in any suitable manner. For example, an internal dimension (or volume) within the clusters or the agglomers can change and an external dimension (or volume) of the clusters or agglomers can remains substantially constant (e.g., between about −40% and 40%) during expansion.

In a first specific example, the expansion is exclusively internal expansion (e.g., internal volumetric expansion), which can be beneficial, for instance, because then the silicon material produces little to no external force on adjacent materials (e.g., coatings, SEI layers, etc.) during expansion. The expansion can be in the primary structural characteristic, secondary structural characteristic, tertiary structural characteristic, a combination thereof, and/or other portion of the material. In this specific example, the primary and/or secondary structural characteristics can expand while the tertiary structural characteristics remain substantially constant.

In a second specific example, the external expansion (e.g., external volumetric expansion) is at most 40% (e.g., at most 0.1%, 0.5%, 1%, 2%, 5%, 10%, 15%, 20%, 25%, 30%, −40%, −30%, −25%, −20%, −15%, −10%, −5%, −2%, −1%, −0.5%, −0.1%, etc., or within a range defined therein), with any other expansion being internal expansion (e.g., internal volumetric expansion). However, the external expansion can be the only expansion that occurs and/or the external expansion can be any suitable amount.

In some variants, the expansion can be correlated with and/or correspond to a decrease in the porosity, pore size, and/or pore size distribution. These variants can be particularly beneficial as the electrical conductivity of these variants can be increased while the silicon material is expanded. However, the expansion can be uncorrelated and/or negatively correlated with the porosity, pore size, pore size distribution, and/or other material characteristics.

The primary structural characteristics 110 of the silicon material preferably refer to the simplest unit (e.g., the simplest unit larger than individual atoms) where more complex structures can be generated and/or built from the primary structural characteristic. However, additionally or alternatively, the primary structural characteristic can refer to the most recognizable feature, the most common feature, the largest feature, the smallest feature, and/or other suitable features of the silicon material.

The primary structural characteristics are preferably nanoparticles 115, but can additionally or alternatively include nanocrystals, mesoparticles, macroparticles, molecular clusters, grain sizes, atoms, and/or any suitable materials. The nanoparticles are preferably spheroidal (e.g., spherical, ellipsoidal, etc.), but can additionally or alternatively include rod; platelet; star; pillar; bar; chain; flower; reef; whisker; fiber; box; polyhedron (e.g., cube, rectangular prism, triangular prism, etc.); have a worm-like morphology; have a foam like morphology; have a morphology as shown for example in FIGS. 11B, 12B, 13B, 14B, 15B, and 16B; and/or other suitable structures. The nanoparticles can be porous or nonporous.

Figure 7A:
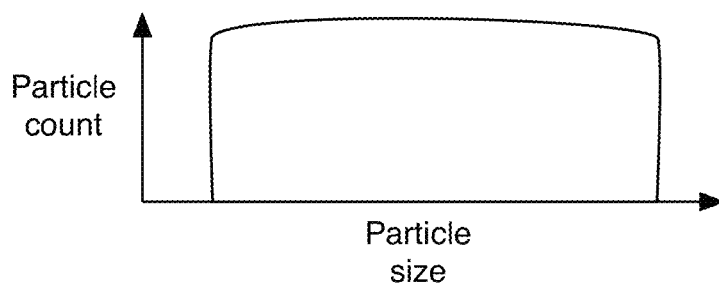
FIGS. 7A, 7B, and 7C are schematic representations of examples of characteristic size distributions of the silicon material.

A characteristic size of the nanoparticles is preferably between about 1 nm to about 500 nm such as 2 nm, 5 nm, 10 nm, 20 nm, 25 nm, 30 nm, 50 nm, 75 nm, 100 nm, 125 nm, 150 nm, 175 nm, 200 nm, 250 nm, 300 nm, 400 nm. However, the characteristic size can additionally or alternatively be less than about 1 nm and/or greater than about 500 nm. In specific examples, the characteristic size can include the radius, diameter, circumference, longest dimension, shortest dimension, length, width, height, pore size, and/or any size or dimension of the nanoparticle. The characteristic size of the nanoparticles are preferably distributed on a size distribution. The size distribution is preferably a substantially uniform distribution (e.g., a box distribution, a mollified uniform distribution, as shown for example in FIG. 7A, etc.) such that the number of nanoparticles (or the number density of nanoparticles with) a given characteristic size is approximately constant (e.g., most common characteristic size differs from the lest common characteristic size by less than 5%, 10%, 20%, 30%, etc.). However, the size distribution can additionally or alternatively correspond to a Weibull distribution, normal distribution, log-normal distribution, Lorentzian distribution, Voigt distribution, log-hyperbolic distribution, triangular distribution, log-Laplace distribution, and/or any suitable distribution.

In a first illustrative example as shown in FIG. 4C, the primary structural characteristic can include porous nanoparticles with characteristic sizes ranging between about 10-500 nm. In a second illustrative example, the primary structural characteristic can include nanoparticles (e.g., porous or nonporous) with characteristic sizes ranging between about 2-150 nm. However, the primary structural characteristic can have any suitable morphology.

As shown for example in FIGS. 4A and 4B, the secondary structural characteristics 120 preferably refer to structures including and/or made of primary structural characteristics. However, the secondary structural characteristics can additionally or alternatively refer to and/or include: a second most common feature (e.g., particle or coating with a characteristic size, material, property, etc.), a feature of a predetermined size range, a second highest frequency of occurrence feature, a second smallest feature, and/or any suitable structures or attributes of the material.

Figure 11A:
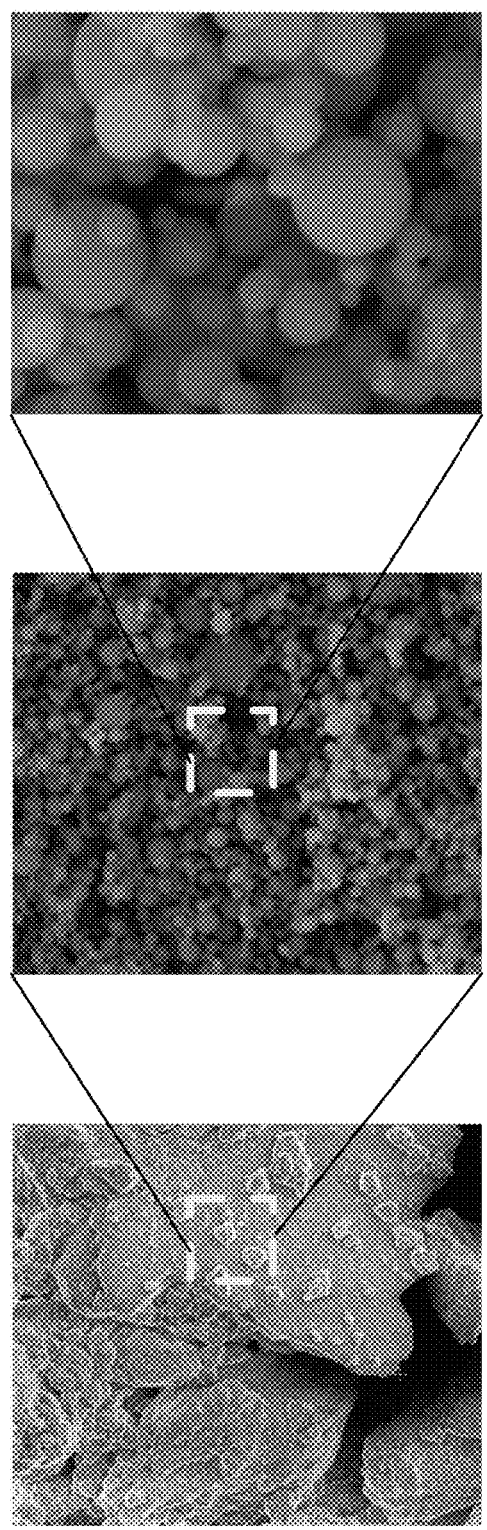
FIGS. 11A and 11B are top down scanning electron micrographs of examples of starting silica material and the resulting silicon material, respectively.
Figure 11B:
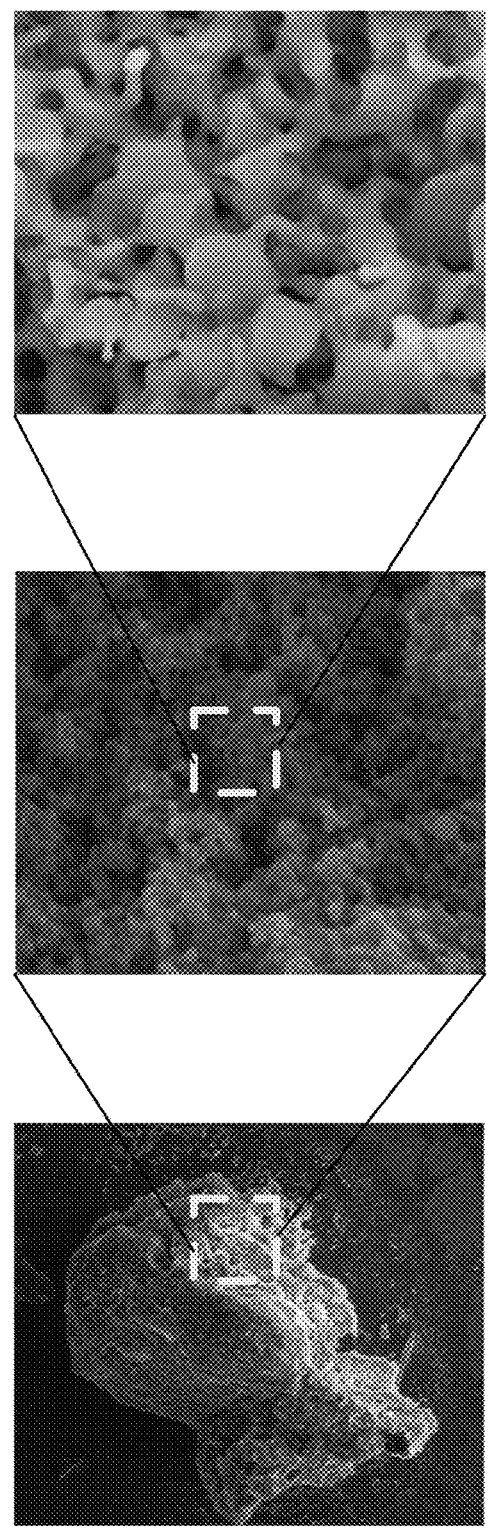
Figure 12A:
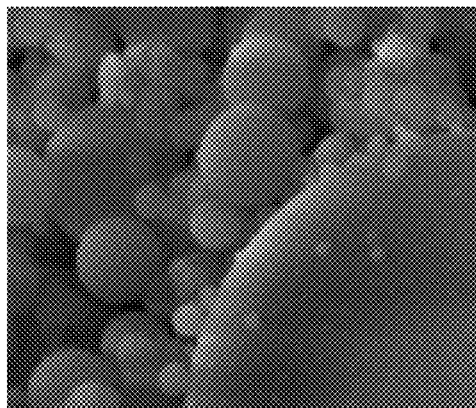
FIGS. 12A and 12B are top down scanning electron micrographs of examples of starting silica material and the resulting silicon material, respectively.
Figure 12B:
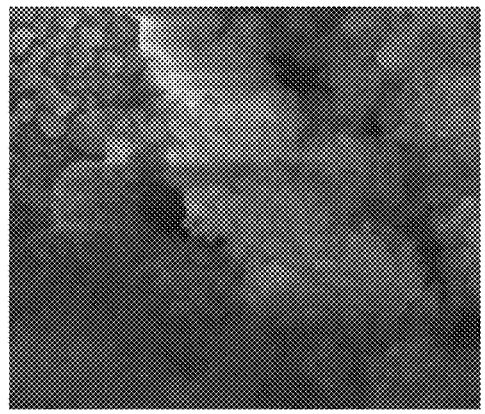
Figure 13A:
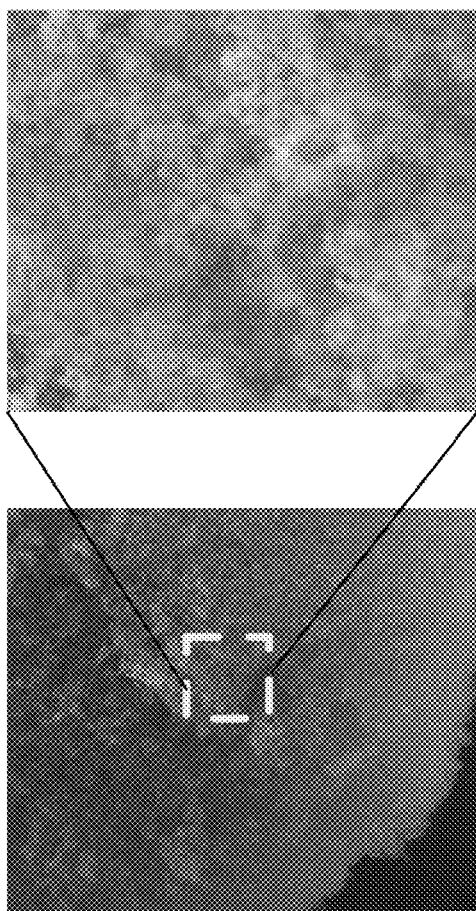
FIGS. 13A and 13B are top down scanning electron micrographs of examples of starting silica material and the resulting silicon material, respectively.
Figure 13B:
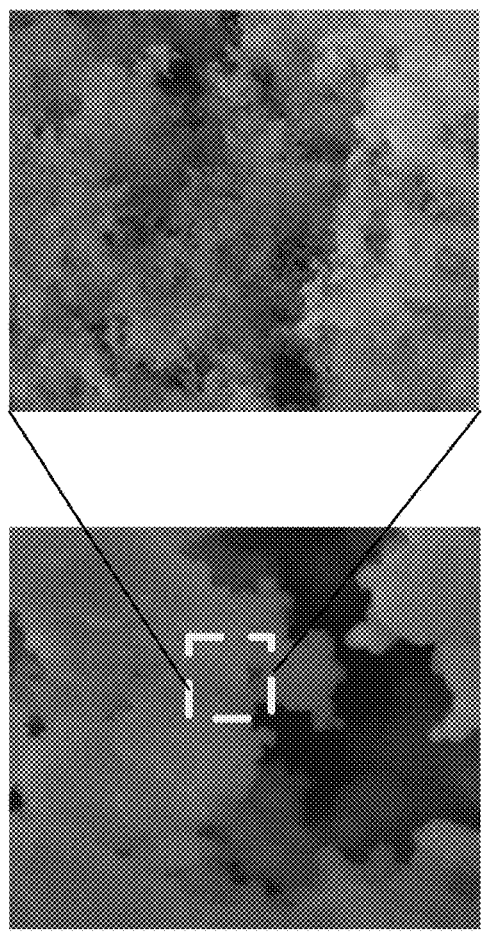
Figure 14A:
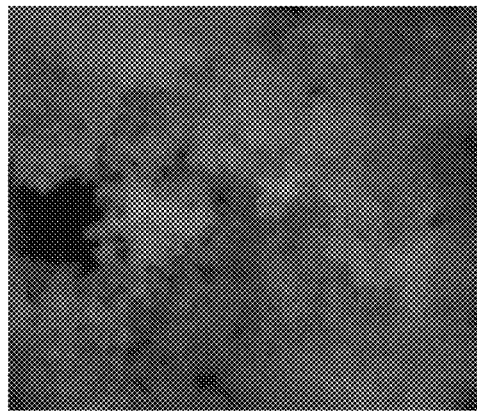
FIGS. 14A and 14B are top down scanning electron micrographs of examples of starting silica material and the resulting silicon material, respectively.
Figure 14B:
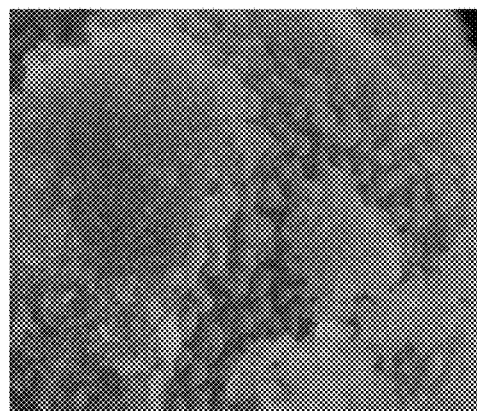
Figure 15A:
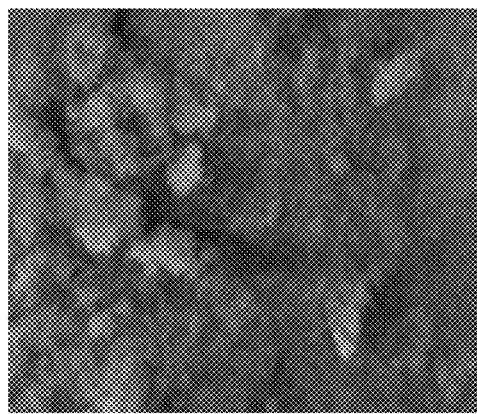
FIGS. 15A and 15B are top down scanning electron micrographs of examples of silica gel starting materials and resulting silicon materials, respectively.
Figure 15B:
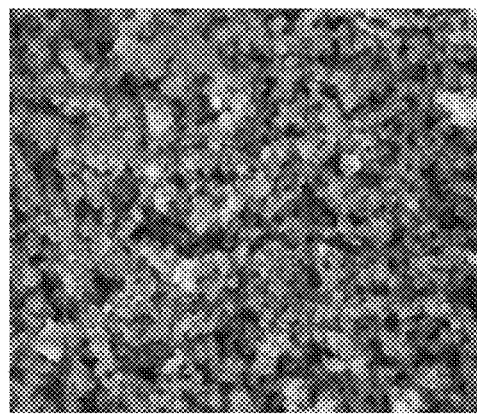

In a preferred embodiment, the secondary structural characteristics include clusters 125 (sometimes referred to as secondary particles or secondary structures) of primary structural characteristics (e.g., nanoparticles). Primary structural characteristics within a cluster can be reversibly and/or irreversibly linked. The nanoparticles can be free-standing (e.g., as shown in FIG. 4A, freestanding cluster 123 or freestanding spheroids), connected to adjacent primary structural characteristics (e.g., via chemical bonds, by a linking material, via physical bonds, etc.), partially or fully fused together (e.g., annealed together; melted into each other; sintered together; form a foam; interconnected cluster 126, as shown for example in FIGS. 3A, 3B, and 4B; etc.), and/or otherwise be coupled to each other within the cluster. The constituent units of the interconnected network (e.g., the primary structural characteristics) can be: permanently interconnected (e.g., annealed, sintered, covalently bonded, adhered, or otherwise mechanically connected), reversibly interconnected (e.g., bonded by ionic bonds, van der Waals bonds, etc.), adjoining (e.g., without an inter-particle bond), and/or otherwise connected together. In some variants, as shown for example in FIGS. 11A and 11B, the silicon structure can include a mixture free-standing and interconnected (e.g., sponge-like) characteristics. However, the silicon structure can include any suitable morphology(s). The primary structural characteristics preferably cooperatively form pores (e.g., empty spaces) within the cluster. However, the nanoparticles can be densely packed (e.g., preventing or minimizing the amount of empty space within clusters) and/or can be otherwise arranged.

The cluster size is preferably between about 300-5000 nm (e.g., larger, smaller, or equal to 300 nm, 400 nm, 500 nm, 600 nm, 700 nm, 800 nm, 900 nm, 1 μm, 1.5 μm, 2 μm, 3 μm, 4 μm, 5 μm, or a range defined therein, etc.). However, the cluster size can be less than 300 nm and/or greater than 5000 nm. The cluster size can be the extent of nanoparticles that are irreversibly connected, a correlation size, a cluster dimension (e.g., longest dimension, shortest dimension, etc.), and/or be any suitable size of the cluster. The cluster size is preferably distributed on a cluster size distribution. The cluster size distribution can be a normal distribution, Weibull distribution, log-normal distribution, Lorentzian distribution, Voigt distribution, log-hyperbolic distribution, triangular distribution, log-Laplace distribution, a substantially uniform distribution, and/or be any suitable distribution.

However, the secondary structural characteristics can include any suitable structures (e.g., depending on the primary structural characteristics).

As shown for example in FIG. 5, the tertiary structural characteristics preferably refer to structures including and/or made of secondary structural characteristics. However, the tertiary structural characteristics can additionally or alternatively refer to and/or include: a third most common feature, a feature of a predetermined size range, a third highest frequency of occurrence feature, a third smallest feature, structures made of a mix of primary and secondary structural characteristics, structures made of primary structural characteristics, and/or any suitable structures or attributes of the material.

In a preferred embodiment, the tertiary structural characteristics 140 include agglomers 135 (sometimes referred to as tertiary particles or tertiary structures, as shown for example in FIG. 3C) of secondary structural characteristics (e.g., clusters) of primary structural characteristics (e.g., nanoparticles). Secondary structural characteristics within an agglomer can be reversibly and/or irreversible linked or connected. The secondary structural characteristics can be free-standing, connected to adjacent clusters (e.g., via chemical bonds, by a linking material, via physical bonds, etc.), partially or fully fused together (e.g., annealed together, melted into each other, sintered together, etc.), and/or otherwise be coupled to each other within the agglomer. The secondary structural characteristics preferably cooperatively form pores (e.g., empty spaces) within the agglomer. However, the secondary structural characteristics can be densely packed (e.g., preventing or minimizing the amount of empty space within agglomers) and/or can be otherwise arranged.

The agglomer size is preferably between about 1-100 μm (e.g., larger, smaller, or equal to 1 μm, 2 μm, 5 μm, 10 μm, 20 μm, 30 μm, 50 μm, 70 μm, 80 μm, 90 μm, 95 μm, 100 μm, or a range defined therein, etc.). However, the agglomer size can be less than 1 μm and/or greater than 100 μm. The agglomer size can be the extent of clusters that are irreversibly connected, a correlation size, an agglomer dimension (e.g., longest dimension, shortest dimension, etc.), and/or be any suitable size of the agglomer. The agglomer size is preferably distributed on an agglomer size distribution. The agglomer size distribution can be a normal distribution, Weibull distribution, log-normal distribution, Lorentzian distribution, Voigt distribution, log-hyperbolic distribution, triangular distribution, log-Laplace distribution, a substantially uniform distribution, and/or be any suitable distribution.

However, the tertiary structural characteristics can include any suitable structures (e.g., depending on the primary structural characteristics, depend on the secondary structural characteristics, etc.).

Figure 7B:
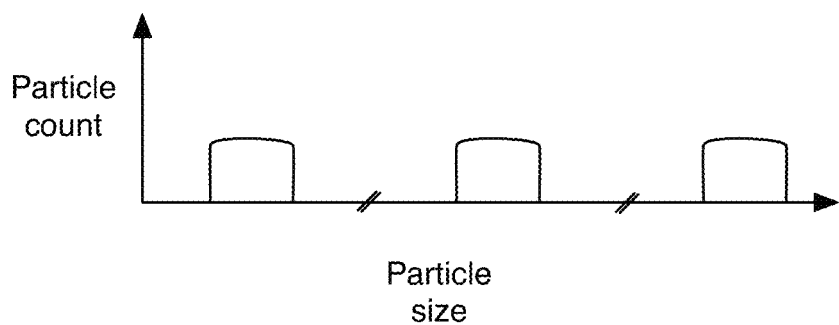
Figure 7C:
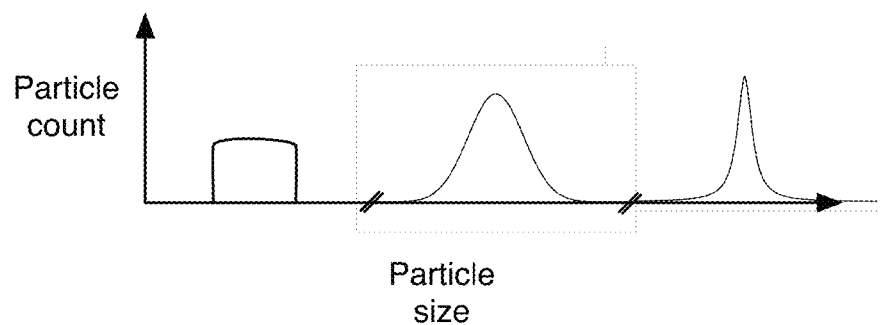

Although the primary, secondary, and tertiary structural characteristics are described separately, there may be no distinction between a primary, secondary, and/or tertiary structural characteristic. For example, as shown in FIGS. 7B and 7C, the silicon material can include structures distributed across a probability distribution ranging from nanometers to millimeters. In a second specific example, the material can include a characteristic size spanning many decades of values (e.g., characteristic size ranges from 1 nm to 100 μm). However, the structural characteristics can additionally or alternatively be defined.

In some embodiments, a surface of the silicon material (e.g., between or on primary, secondary, and/or tertiary structural characteristics) can be partially or fully fused together (e.g., melted, forming a solid coextensive surface, etc.). The surface preferably refers to an external surface (e.g., a surface outside the porous network), but can refer to an internal surface (e.g., within the porous network), a surface coextensive with an internal and external surface, and/or any suitable surface. The surface can include structures (e.g., islands, solidified pools of silicon or other material(s), amorphous structures, as shown for example in FIG. 12B, etc.), be smooth (e.g., have a surface roughness less than a threshold roughness), be rough (e.g., have a surface roughness exceeding a threshold roughness), and/or have any morphology. The thickness of the fused surface can be a value or range between about 1 nm to 1 μm (e.g., 1 nm, 2 nm, 5 nm, 10 nm, 20 nm, 30 nm, 50 nm, 100 nm, 200 nm, 300 nm, 500 nm, 1000 nm, etc.), less than 1 nm, and/or greater than 1 μm. Under the (fused) surface, the silicon material is preferably porous (e.g., has a structure as described above), but can have any suitable structure.

Figure 6A:
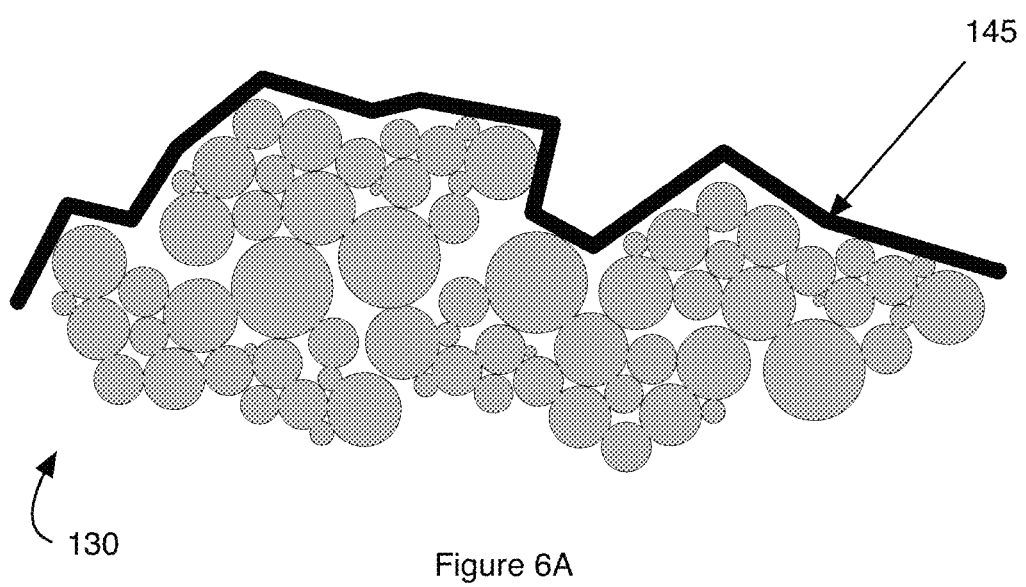
FIGS. 6A, 6B, and 6C are schematic representations of examples of coated silicon material where the coating covers the tertiary, secondary, and primary structures respectively.
Figure 6B:
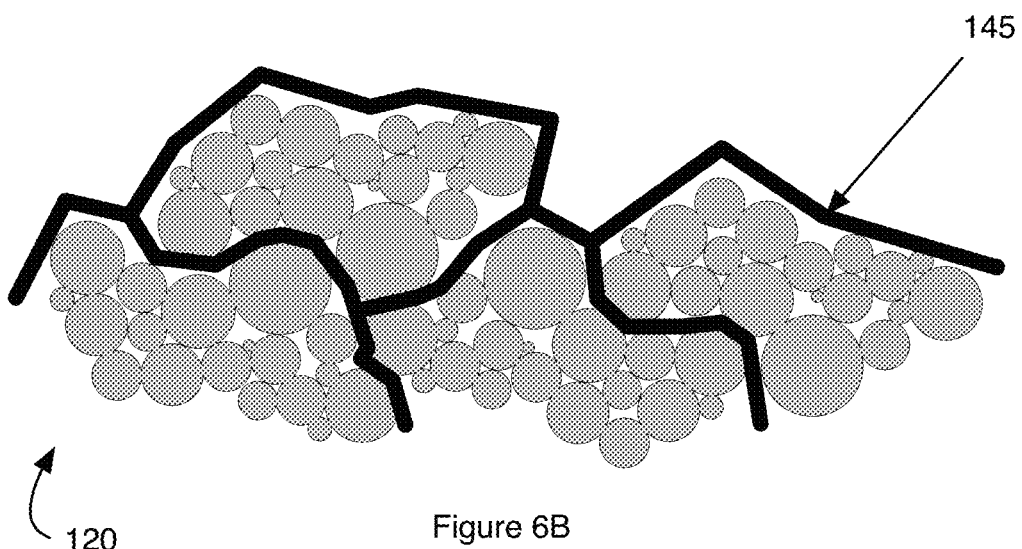
Figure 6C:
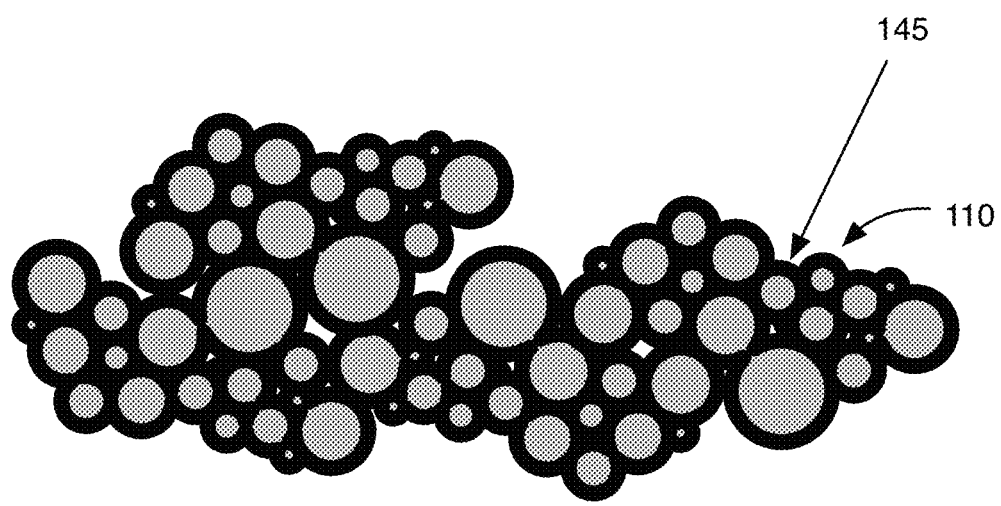

The optional additive(s) 140 can function to improve the electrical conductivity of the silicon material, provide mechanical stability for the silicon material (e.g., retain a secondary structural characteristic, retain a tertiary structural characteristic, hinder or prevent expansion of the silicon material, etc.), modify the reaction rate of the material during manufacturing, and/or otherwise modify properties of the silicon material. The additive(s) can cover the entire exposed surface of the silicon material and/or underlying additives (e.g., be a coating), cover a subset of the exposed surface of the silicon (e.g., specific regions of the silicon material, be porous, perforated, etc.) and/or underlying additives, cover a predetermined extent of the silicon material and/or underlying coatings, fill some or all of the pore volume, enter the silicon lattice (e.g., form an alloy), and/or otherwise be interfaced with the silicon material and/or underlying coatings. In a preferred embodiment, the additive(s) (e.g., coatings) preferably do not enter the pores of the silicon material (e.g., the coatings blanket or coat the higher-level characteristics, such as the secondary and/or tertiary structural characteristics, without coating the lower-level characteristics, such as the primary structural characteristics, as shown for example in FIGS. 6A and 6B, etc.). In a specific example of this embodiment, the additive can coat the secondary particles (e.g., clusters) and/or tertiary particles (e.g., agglomers) without coating primary particles (e.g., nanoparticles). However, the additives can partially enter the pores (e.g., extend into, be anchored and/or supported at the edges of the pore forming a catenary or catenary like shape into the pore, etc.), conformally coat or interact with the surface of the silicon material (e.g., coat the primary structural characteristics, as shown for example in FIG. 6C, etc.), and/or otherwise be interact with the silicon material. In embodiments where the additive enters the pores (e.g., coats the primary particles), the additive loading (e.g., the extent of internal volume filling) is preferably between about 1% and 80%. However, the additive loading can be less than 1% or greater than 80%. The additive(s) can be anchored (e.g., bonded to, adhered to, connected, etc.), not anchored to, integrated in, and/or otherwise be coupled to the silicon material and/or other coatings.

At least one additive is preferably electrically conductive (e.g., electrical conductivity at least about 10,000 siemens/meter ($S*m^{-1}$), resistivity at most about $10^{-4}$ $\Omega$m, etc.). However, the additives(s) can additionally or alternatively be semiconducting, electrically insulating, dielectric, and/or have any electrical conductivity.

The additives(s) preferably conduct and/or enable $Li^+$ diffusion. However, one or more additive can be impenetrable or poorly conduct or enable $Li^+$ diffusion.

In variants where the additives include a coating, the coating thickness is a value or range thereof preferably between about 1-10 nm such as 1 nm, 2 nm, 2.5 nm, 3 nm, 4 nm, 5 nm, 6 nm, 7 nm, 8 nm, 9 nm. However, the coating thickness can be less than 1 nm or greater than 10 nm. The coating thickness can be substantially the same and/or vary over the extent of the silicon material. The coating thickness is preferably chosen to allow ions (e.g., $Li^+$ ions) and/or other materials (e.g., electrolytes) to penetrate the coating. However, the coating can be impenetrable to ions, can include one or more pores and/or perforations to enable the materials to pass through (e.g., at predetermined locations), and/or electrolyte and/or otherwise be permeable to one or more substances. The coating thickness can depend on the coating material, the material of one or more other coatings, and/or otherwise depend on the silicon material.

In some embodiments, the coating(s) can include one or more structures such as nanostrucutres, mesostructures, microstructures, and/or macrostructures. The structures can be selected (e.g., engineered) to modify one or more coating and/or silicon material property such as optical appearance of the silicon material (e.g., reflection, transmission, absorption, and/or scattering of light), a substance diffusion or permeability through the coating, and/or other properties. Examples of structures include pores, grooves, paths, perforations, and/or other structures.

The additive material is preferably carbonaceous, but can additionally or alternatively include metal (e.g., lithium, magnesium, etc.), oxides (e.g., $SiO_x$), inorganic polymers (e.g., polysiloxane), metallopolymers, and/or any suitable materials. Examples of carbonaceous materials include: organic molecules, polymers (e.g., polyethylene (PE), polypropylene (PP), polyvinyl chloride (PVC), polystyrene (PS), polyurethane (PU), polyamide, polyacrylonitrile (PAN), polyacrylamide, polylactic acid, polyethylene terephthalate (PET), phenolic resin, polypyrrole, polyphenylene vinylene, polyacetylenes, polyfluorene, polyphenylene, polypyrene, polyazulene, polynapthalene, polycarbazole, polyindole, polyazepine, polyaniline, polythiophene, polyphenylene sulphide, poly(3,4-ethylenedioxythiophene), recycled polymers, etc.); inorganic carbon (e.g., amorphous carbon, charcoal, diamond, graphite, graphene, nanorods, etc.), and/or any suitable carbonaceous materials. When the additive is carbonaceous, the carbon to silicon ratio can be approximately 1:8, 1:7, 1:6, 1:5, 1:4, 1:3, 1:2, 2:1, 3:1, 4:1, 5:1, 6:1, and/or any other ratio. However, any carbon to silicon ratio can be used.

In a first illustrative example, the silicon material can be coated with an approximately 1-5 nm thick carbon coating. The carbon coating can coat the secondary and/or tertiary structural characteristics of the silicon material (e.g., with or without coating the primary structural characteristics of the silicon material).

Figure 6D:
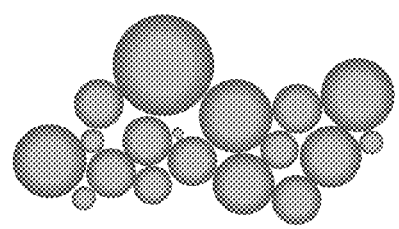
FIG. 6D is a schematic representation of an example of a silicon material with a silicon oxide coating.

In second illustrative example as shown in FIG. 6D, a silicon material can include a silicon oxide coating. In this illustrative example, the silicon material can include a silicon core and a silicon oxide shell. In this illustrative example, the shell can be between about 1-5 nm thick. The shell can include a gradient of $SiO_x$ (e.g., radial gradient, having a higher oxygen concentration closer to the external environment and a lower oxygen content closer to the center of the material), uniform SiOx, and/or any suitable distribution of $SiO_x$.

4. Method

A method 20 for manufacturing a silicon material can include reducing the silica to silicon S250. The method of manufacture can optionally include purifying the silica S210, exposing the silica to reaction modifiers S220, purifying the mixture of silica and reaction modifier(s) S230, comminuting the silica S240, purifying the silicon S260, coating the silicon S270, and/or any suitable steps. The method of manufacture preferably functions to manufacture a porous silicon material (e.g., a spongey silicon material) such as the silicon material described above. However, the method of manufacture can be used to generate any suitable material.

The method of manufacture preferably uses impure silica (e.g., silica with an $SiO_2$ content less than about 99%) as the starting material. However, the method of manufacture can use purified silica (e.g., silica with an $SiO_2$ content greater than about 99%) and/or any suitable silicon oxide starting material. The starting material is preferably a waste material leftover from a different process. However, the starting material can be mined, pre-processed silica, recycled silica, acquired silica, and/or any suitable starting material. The silica starting material can be provided as a powder, dust, slurry, colloid, suspension, solution, dispersion, and/or in any suitable form (e.g., in one or more steps of the process). Examples of starting materials include: fumed silica, cabo-Sil® fumed silica, silica dispersions (e.g., fumed silica dispersed in a solvent such as water; cab-o-Sperse® fumed silica; etc.), Aerosil® fumed silica, Sipernat® silica, silica fumes, precipitated silica, silica gels, XYSIL® fumed silica, Orisil fumed silica, Konasil® fumed silica, Reolosil® fumed silica, Zandosil fumed silica, pyrogenic silica, silica aerogels, decomposed silica gels, silica beads, silica sand, fiberglass, and/or any suitable silica source.

The silica starting material preferably includes (e.g., is received with) nanoparticles. However, the silica starting material can be converted into nanoparticles, include mesoparticles, microparticles, macroparticles, and/or have any morphology. A feature size (e.g., characteristic size) of the silica starting material is preferably between 1 and 500 nm, but can be less than 1 nm or greater than 500 nm. The method of manufacture preferably converts the silica (e.g., silica nanoparticles) into silicon (e.g., silicon nanoparticles). The conversion from silica to silicon can substantially preserve the structure of the original starting material (e.g., a silicon material characteristic, such as the primary structural characteristics, can have substantially the same shape, size, and/or interconnectivity as the silica starting material) and/or can change the structure of the original starting material (e.g., the silicon nanoparticles can be fused whereas the initial silica nanoparticles can be free standing). However, the conversion can otherwise convert the silica to silicon (e.g., the silica structure can evaporate, dissolve, and/or otherwise disintegrate and reform into a silicon structure).

The particles of silica starting material are preferably between about 1 nm and 10 µm, but can include particles that are smaller than 1 nm or larger than 10 µm. The size distribution of the silica particles can be any size distribution as described for the primary characteristic size distribution of the silicon above and/or any size distribution. The particles can be spheroidal (e.g., spherical, ellipsoidal, etc.), irregular, plates, worm-like, sponge-like, foam-like, interconnected spheroids, have a shape as described for the silicon particles, have a morphology as shown for example in FIGS. 11A, 12A, 13A, 14A, 15A, and 16A, and/or have any shape. In some variants, silica particles having different morphologies can be combined (e.g., mixed) together to provide a hybrid or combined structure (as shown for example in FIGS. 11A and 11B) in either the silica starting material or the resulting silicon.

In variants, the silica particles can be aggregated into clusters, agglomers, secondary particles, and/or tertiary particles. The silica aggregates can have an aggregate size between about 20 nm and 100 µm, but the aggregate size can be less than 20 nm or greater than 100 µm. The aggregate size distribution can be a size distribution as described above for the secondary and/or tertiary structural characteristics and/or have any aggregate size distribution. When the silica particles are aggregated into aggregates larger than a predetermined size, the method can optionally include comminuting the aggregates (e.g., using the methods described in S240) to generate smaller starting material.

The purity of the starting silica is preferably between about 80% to 95% silica and/or silicon oxide (e.g., more than, less than, or equal to 80%, 82%, 85%, 87%, 90%, 92%, 94%, 95%, or range therebetween, etc.). However, the purity of the starting silica can be less than 80% and/or greater than 95%. The remainder of the starting material can include alkali metals, alkaline earth metals, transition metals, post-transition metals, metalloids, lanthanides, actinides, nonmetals, combinations thereof, and/or any suitable impurities. Specific examples of impurities (e.g., the remainder) can include: oxides (e.g., sulfur oxides such as $SO$, $SO_2$, $SO_3$, $S_7O_2$, $S_6O_2$, $S_2O_2$, etc.; sodium oxide; potassium oxide; aluminium oxide; iron oxides such as $FeO$, $Fe_3O_4$, $Fe_2O_3$, etc.; magnesium oxide; water; nitrogen oxides such as $NO$, $NO_2$, $NO_3$, $N_2O$, $N_2O_2$, $N_2O_3$, $N_2O_4$, $N_2O_5$, etc.; etc.), chlorides (e.g., sodium chloride, potassium chloride, chlorine, etc.), carbonaceous material (e.g., organic carbon, inorganic carbon, amorphous carbon, etc.), silicon, and/or other impurities. The purity level of the silica starting material can affect the resultant silicon product (e.g., a feature size such as a primary, secondary, and/or tertiary characteristic size; morphology; etc.). For example, the melting point of the starting material can depend on an impurity type (e.g., specific elements) and/or amount. In an illustrative example, the melting points (eutectic points) of a Mg—Si alloy is 637.4° C. when the silicon atomic percent is 1.45% and is 946.5° C. when the silicon atomic percent is 54.12%. When one or more impurities are incorporated in the starting material, various eutectic points can further decrease (or increase) the melting points of the starting material (e.g., spatially or locally varying melting points such based on an alloy spatial distribution; modify the melting point of the entire starting material; etc.). Accordingly, in some variants, one or more impurities could be introduced (and/or not removed) to control (e.g., lower, increase) the processing temperature, control (e.g., decrease or increase) the processing time, modify the porous structure, and/or otherwise impact the resulting silicon.

The silica starting materials can have a low surface area (e.g., less than about 1, 2, 5, 10, 25, 50 $m^2$ $g^{-1}$, etc.) or a high surface area (e.g., greater than about 25, 30, 50, 75, 100, 150, 200, 500, 750, 1000, 1500, 2000 $m^2$ $g^{-1}$, etc.). In some variants, starting material with low surface area can provide the benefit of requiring less stringent control over processing parameters (e.g., temperature, pressure, etc.). In some variants, starting materials with high surface area can provide the benefit of a finished material with greater surface area.

In variants, starting materials with a high surface area can produce better processed materials by tight control over processing parameters (e.g., temperature, temperature gradient, pressure, reaction completion, reaction vessel design, degree of mixing of materials, etc.). However, the finished material can have suitable properties with any processing parameters.

A porosity of the silica starting material is preferably between about 5% and 90%, but can be less than 5% or greater than 90%. The porosity can depend on the silica morphology (e.g., particle size, characteristic size, shape, etc.), silica source, impurities in the silica, and/or any suitable properties. A pore volume of the silica starting material is preferably between about 0.02 and 2 $cm^3$ $g^{-1}$, but can be less than 0.02 $cm^3$ $g^{-1}$ or greater than 2 $cm^3$ $g^{-1}$. The pore size of the silica starting material is preferably between about 0.5 and 200 nm, but the pore size can be smaller than 0.5 nm or greater than 200 nm. The pore size distribution can be similar to and/or the same as described for the silicon material above and/or any suitable pore size distribution.

A tap density of the silica starting material is preferably between about 0.01 and 5 $g$ $cm^{-3}$ (e.g., 0.02, 0.05, 0.1, 0.2, 0.5, 1, 2, $g$ $cm^{-3}$ etc.), but the tap density can be less than 0.01 $g$ $cm^{-3}$ or greater than 5 $g$ $cm^{-3}$.

The method can be performed as a batch process, continuous process, roll-to-roll process, barrel process, bench scale, and/or at any suitable scale and/or processing methodology. The method is preferably performed in a reaction vessel (e.g., a container that separates the reaction occurring inside from an external environment proximal the reaction vessel; a container that maintains substantially uniform reaction conditions such as temperature, pressure, reagent concentrations, etc. within the container; etc.).

However, the method can be performed exposed to atmosphere and/or in any suitable container. The reaction vessel is preferably, but does not have to be, configured to enable heat dissipation during the reaction. The reaction vessel can include a stirring or agitation mechanisms that functions to move one or more reactants (e.g., silica, reaction modifiers, etc.) during the reduction. Examples of stirring or agitation mechanisms include: blowers, fans, blades, paddles, stirbars (e.g., magnetic stirrers), shakers, speakers, and/or any suitable mechanisms. In a first illustrative example, the method and/or steps thereof can be performed in a 600 liter or greater barrel (e.g., stainless steel barrel), wherein the barrel can be open or sealed. In a second illustrative example, the method and/or steps thereof can be performed in trays within a furnace (e.g., tube furnace), where a depth of the trays can be between about 1 mm to about 5 inches. In a third illustrative example, the method and/or steps thereof can be performed using a belt furnace (e.g., wherein the material is spread over the belt). In a fourth illustrative example, the method and/or steps thereof can be performed in an oven (e.g., furnace), where silica starting material can be added to the oven from an opening (e.g., in the top of the oven, in a side of the oven) and one or more reaction modifiers (e.g., reducing agent such as magnesium or aluminium) can be provided as a vapor within the oven chamber. In this illustrative example, the silica can be moved (e.g., stirred, blown, etc.) during the reaction. However, the method can be performed at any suitable scale and/or in any manner.

Optionally purifying the silica starting material S210 functions to remove one or more impurities from the silica starting material. Impurities can include molecular impurities (e.g., non-silicon derived materials, organic materials, etc.), dust, oil, solvents, metals, dirt, processing chemicals (e.g., from upstream processes), and/or any suitable materials. Purifying the silica starting material can include washing the starting material, etching the starting material (e.g., selectively etching impurities), using a phase change (e.g., melting, freezing, evaporating, sublimating, condensing, desublimating, etc. the starting material and/or the impurities), centrifuging the starting material, and/or otherwise purifying the starting material.

Purifying the starting material can be performed at a purification temperature. The purification temperature is preferably between about 0° C. and 100° C., but can be less than 0° C. or greater than 100° C. The purification temperature is preferably less than a critical temperature of silica (e.g., melting temperature, annealing temperature, phase transition temperature, etc.), but can be greater than the critical temperature.

The purifying process can be performed for a purification time between about 1 minute to about 72 hours. However, the purifying process can be performed for less than a minute or more than 72 hours.

The purifying process can be repeated (e.g., 2×, 3×, 5×, lox, etc.), which can function to further improve the purity of the starting material, remove additional impurities, and/or otherwise function. The repeated purifying processes can be identical (e.g., same process, same temperature, same duration, same solvent, etc.) and/or different (e.g., performed at different temperatures, for different durations, using different processes, different solvents, etc.).

In a preferred embodiment, purifying the starting material can include washing (e.g., rinsing, soaking, etc.) the starting material with a solvent. Examples of solvents that can be used include: water, alcohols (e.g., methanol, ethanol, 1-propanol, 2-propanol, 1-butanol, 2-butanol, isobutanol, t-butanol, diols, triols, sugar alcohols, etc.), ethers (e.g., dimethyl ether, diethyl ether, methylethyl ether, etc.), esters, aldehydes, ketones (e.g., acetone), halogenated solvents (e.g., chloromethane, dichloromethane, chloroform, carbon tetrachloride, bromomethane, dibromomethane, bromoform, carbon tetrabromide, iodomethane, diiodomethane, iodoform, carbon tetra iodide, dichloroethane, dibromoethane, etc.), and/or any suitable solvents.

In some variants of this embodiment, the starting material can be washed with acidic and/or basic solutions (e.g., in addition to or instead of using solvent). Examples of acids that can be used include: hydrofluoric acid, hydrochloric acid, hydrobromic acid, hydroiodic acid, sulphuric acid, nitric acid, nitrous acid, acetic acid, carbonic acid, oxalic acid, phosphoric acid, citric acid, trifluoracetic acid, perchloric acid, perbromic acid, periodic acid, acid piranha (e.g., a mixture of sulphuric acid and hydrogen peroxide), and/or any suitable acids. Examples of basic solutions can include: lithium hydroxide, sodium hydroxide, potassium hydroxide, rubidium hydroxide, cesium hydroxide, beryllium hydroxide, magnesium hydroxide, calcium hydroxide, strontium hydroxide, barium hydroxide, ammonium hydroxide, basic piranha (e.g., a mixture of hydroxide and hydrogen peroxide), and/or any suitable bases. The acid or base solutions preferably have a concentration that is between about 1 M and 12 M. However, the solutions can have a concentration less than 1M, greater than 12 M, be fully concentrated (e.g., sulphuric acid with a concentration of 18.4 M, sodium hydroxide dissolved in water to a concentration of 17.6 M, etc.), and/or have any suitable concentration. In these variants, washing the starting material can include neutralizing the starting material. The neutralization can include adding acid (e.g., a weak acid such as citric acid, a low concentration acid, etc.), adding base (e.g., a weak base such as sodium hydroxide, a low concentration base, etc.), diluting the starting material (e.g., serial dilutions with a solvent such as water), and/or otherwise neutralizing the starting material.

In some variants, S210 can include drying the starting material, which functions to remove residual solvent from the starting material. Drying the starting material can include heating the starting material (e.g., above a solvent boiling point, within 50° C. of a solvent boiling point, etc.), decreasing an atmospheric pressure proximal the starting material (e.g., applying a vacuum), blowing air or another gas over the starting material (e.g., dry air), rinsing with a solvent with lower vapor pressure (e.g., a second solvent that is miscible with the first solvent and has a lower vapour pressure than the first solvent), and/or otherwise drying the starting material. In an illustrative example, the starting material can be dried in a vacuum (e.g., pressure between about $10^{-10}$ mBar to about 1000 mBar) at 80° C. for between about 1 and 24 hours. However, the starting material can be dried at a temperature between about 0° C. and 100° C., less than 0° C., and/or greater than 100° C. However, the starting material can be dried in any manner.

In a first illustrative example of S210, the starting material can be washed with a hydrochloric acid solution with concentration between about 6 and 12 M at a temperature between about 200 and 75° C.

In a second illustrative example of S210, the starting material can be washed with solvents such as water, ethanol, isopropyl alcohol, and/or acetone. The starting material can be washed with the solvents sequentially (e.g., in an order of increasing and/or decreasing polarity) and/or at the same time (e.g., using a solvent mixture). In this specific example, the starting material can be dried in an oven at a temperature between about 60° C. and 100° C. for between 1-24 hours.

However, the starting material can be purified in any manner.

Exposing the silica to one or more reaction modifiers S220 functions to introduce one or more reaction modifier that influences and/or directs the reduction of the silica to silicon. Reaction modifiers can change the reaction kinetics, change the reaction thermodynamics, enhance a uniformity of the reaction, change a reaction temperature, modify a reaction product or byproduct, change a reaction pressure, and/or otherwise modify the reaction. Exposing the silica can include: mixing, combining, depositing (e.g., drop casting, spin coating, chemical vapor deposition (CVD), sputter deposition, etc.), and/or otherwise exposing the silica to the reaction modifier. Unpurified silica (e.g., silica starting material) and/or purified silica (e.g., silica processed by S210) can be exposed to the reaction modifier. S220 is preferably performed after S210, but S220 can be performed before and/or at the same time as S210. Examples of reaction modifiers include salt(s), catalysts, reducing agents, oxidizing agents, polymers, conductive additives, and/or other substances.

The reaction modifier and silica can be homogeneously mixed, or inhomogeneously mixed. The reaction modifier can partially or fully coat some or all of the silica, fill a predetermined proportion of the silica pores (e.g., of the silica primary, secondary, and/or tertiary structure), remain outside of the silica structure(s), and/or otherwise interface with the silica. However, the reaction modifier and silica can be otherwise exposed and/or interface with one another. An inhomogeneous mixture can be provided by incomplete mixing, layering materials, and/or otherwise be achieved. In an illustrative example, a layered reaction material can include a reducing agent layer, with a salt layer on the reducing agent layer, with a silica layer above the salt layer. However, the different materials can be provided in any order. A homogeneous mixture can be promoted using smaller reducing agent particle size, more complete mixing (e.g., longer mixing times), and/or be otherwise provided.

The reaction modifier and silica can be mixed dry (e.g., vortex, ball milling, etc.) or wet (e.g., dissolved and/or suspended in water or another suitable solvent). The relative amount of and/or the degree of mixing of the reaction modifier and the silica can influence the final silicon product (e.g., morphology, uniformity, structure, etc.). In a first illustrative example, when a larger mesh reducing agent and/or not salt coating is used, the resulting silicon material can include a more interconnected particle network and/or larger silicon particle size (e.g., larger characteristic sizes) than when a smaller mesh reducing agent and/or a salt coating is used (e.g., a smaller mesh can result in more freestanding silicon particles). In a related example, when a larger mesh reducing agent and/or larger particle size reducing agent is used, the yield of silicon and/or the reduction efficiency can be less than when a smaller mesh and/or smaller reducing agent particle size is used. In a second illustrative example, when a salt coats the silica, the resulting silicon particles can include more free standing particles and/or smaller silicon particles than when no salt and/or a solid mixture of salt and silica is used. In a related example, when a smaller salt particle (e.g., salt coating, comminuted salt, etc.) is used, the silicon yield and/or reaction efficiency can be greater than when a larger salt particle (e.g., as received salt, no salt) is used. However, the final silicon product and/or reaction yield can be independent of the relative amount of and/or the degree of mixing of the reaction modifier and silica.

The ratio of silica to the reaction modifiers (e.g., mass ratio, volume ratio stoichiometric ratio, etc.) can be any value or range thereof between about 1000:1 to about 0.001:1, such as 100:1, 10:1, 5:1, 4:1, 3:1, 2:1, 1:0.7, 1:1, 1:1.2, 0.9:1, 0.8:1, 0.75:1, 0.7:1, 0.6:1 0.5:1, 0.4:1, 0.3:1, 0.25:1, 0.2:1, 0.1:1, 0.01:1, and/or any range therebetween. The ratio can be of the silica to: each reaction modifier, all reaction modifiers, a particular reaction modifier, or be otherwise defined. However, one or more reaction modifier can have a ratio to silica that is greater than about 1000:1 or less than about 1:1000. However, the ratio of silica to reaction modifier can be any suitable ratio.

In a first embodiment of S220, the silica can be exposed to one or more salts.

The salt can function to produce a more uniform reducing environment (e.g., during S250; such as uniform temperature, uniform pressure, uniform reagent concentration, etc.). The salt can include any suitable cation and anion. Examples of cations include: metal ions, ammonium, quaternary ammonium, pyridinium, histidinium, and/or any suitable cation. Examples of anions include: halides, acetate, carbonate, citrate, cyanide, nitrate, nitrite, sulphate, sulphite, phosphate, hydroxides, chalcogenides, pnictogenides, and/or any suitable anions. Specific examples of salts include but are not limited to: LiCl, LiBr, LiI, NaCl, NaBr, NaI, KCl, KBr, KI, RbCl, RbBr, RbI, CsCl, CsBr, CsI, $BeCl_2$, $BeBr_2$, $BeI_2$, $MgCl_2$, $MgBr_2$, $MgI_2$, $CaCl_2$, $CaBr_2$, $CaI_2$, $SrCl_2$, $SrBr_2$, $SrI_2$, $BaCl_2$, $BaBr_2$, $BaI_2$, and/or combinations thereof.

In a first variant of the first embodiment, as shown for example in FIG. 1A, the salt and the silica can be mixed (e.g., in the solid state) to form a substantially homogenous solid mixture of salt and silica. In a related variant, the salt and silica can be mixed in a solvent, where the salt and silica are substantially insoluble (e.g., greater than about 1000 mass parts of solvent required to dissolve 1 mass part of salt or silica); and the solvent can be removed (e.g., by decanting, centrifugation, evaporation, etc.).

Figure 10A:
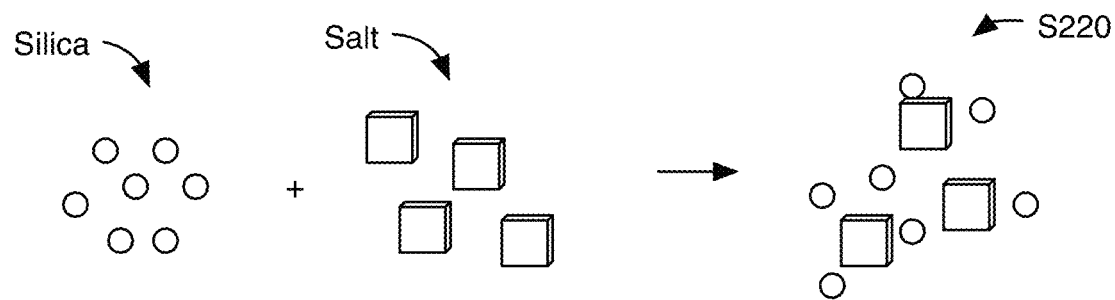
FIGS. 10A and 10B are schematic representations of examples of combining a salt and silica.
Figure 10B:
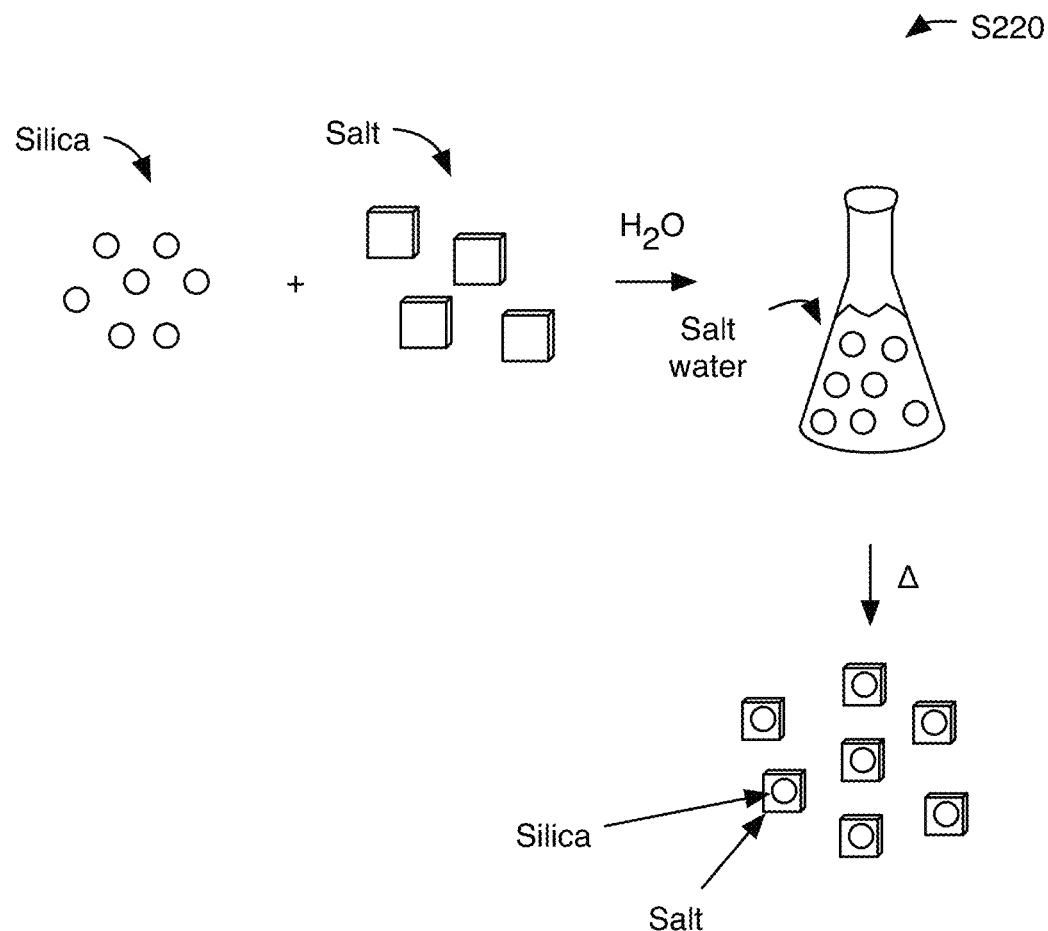

In a second variant of the first embodiment, as shown for example in FIG. 10B, the salt can coat the silica, which can have the benefit of providing a more uniform reducing environment for the silica (e.g., more uniform than a reducing environment without salt, more uniform than a solid state mixture of the salt and silica, etc.). In a specific example, salt coated silica can be prepared by mixing the salt and silica in a solvent where the silica is substantially insoluble and the salt is soluble (e.g., less than about 1000 mass parts of solvent required to dissolve 1 mass part of salt) and evaporating the solvent. However, the salt can additionally or alternatively be coated using a deposition (e.g., sputtering, CVD, ALD, etc.) and/or any coating method.

In a third variant of the first embodiment of S220, the sample can include a mixture of salt coated silica and free salt (e.g., a combination of the first and second variant of the first embodiment of S220). However, the silica can be exposed to one or more salt in any manner.

In a second embodiment of S220, the silica can be exposed to one or more reducing agent. The reducing agent can function to reduce the silica to silicon. Examples of reducing agents include: alkali metals, alkaline earth metals, metalloids, transition metals, hydrides (e.g., LiH, NaH, KH, $LiAlH_4$, $NaBH_4$, $N_2H_2$, etc.), carboxylic acids (e.g., oxalic acid, formic acid, ascorbic acid, etc.), pnictogens (e.g., nitrogen, phosphorous, arsenic, antimony, bismuth, phosphite, hypophosphite, phosphorous acid, etc.), combinations thereof, and./or any suitable reducing agent. The reducing agent is preferably homogeneously mixed (e.g., in the solid state) with the silica, but can be inhomogeneously mixed with the silica, coat the silica, and/or otherwise be exposed to the silica. The reducing agent is preferably a powder, but can additionally or alternatively be a sheet, nanomaterial, solid (e.g., grid, surface, etc.), liquid, gas, and/or have any suitable morphology and/or phase. For example, the reducing agent can include magnesium, aluminium, calcium, lithium, and/or titanium. The reducing agent can be provided as particles having any suitable size between about 20 µm and 400 µm (corresponding to meshes of 635 to 40 respectively). However, the particles can be smaller than 20 µm, greater than 400 µm, and/or have any suitable size and/or size distribution. The size of the reducing agent particles (and/or any reducing material) can be used to modify and/or influence the final silicon material (e.g., the product of S250). For instance, when a smaller mesh reducing agents is used, the resulting silicon particles can include more free standing particles than when a larger mesh reducing agent is used (e.g., a larger mesh can result in a more interconnected silicon material). However, the size of the reducing agent can have any suitable outcome on the resulting silicon material. However, any suitable reducing agent can be used.

In a third embodiment of S220, the silica can be coated with and/or include a protective additive. The protective additive can function to inhibit or slow the reducing agent diffusion to the silica surface. Examples of protective additives can include: sodium, carbonaceous materials (e.g., amorphous carbon, porous carbon, nanocarbon, etc.), polymers (e.g., polypyrrole, polyacrylonitrile, resin, etc.), and/or any suitable materials. The protective additive can be applied and/or generated using CVD, spray coating, dip coating, spin coating, coating processes as described in S270, and/or in any manner.

In a fourth embodiment of S220, the silica can be exposed to an additive or additive precursor. Exposing the silica to the additive and/or additive precursor can function to provide one or more species that can undergo a reduction (e.g., during any of steps S230 through S280) to provide a coating and/or other additive to the silicon material. Examples of additive precursors include carbon sources (e.g., polymers, carbonaceous material, etc.), lithium sources (e.g., lithium salts), oxygen sources (e.g., oxidizing agents), and/or any suitable additive source. The additive and/or additive precursor can be mixed with, coat, be in contact with, be adjacent to, and/or otherwise couple to the silica.

In a fifth embodiment of S220, the silica can be exposed to a salt, a reducing agent, a protective additive, and/or an additive precursor (e.g., the first, second, third, and fourth embodiments of S220 are not mutually exclusive).

However, the silica can be exposed to any suitable reaction modifier.

Purifying the silica and reaction modifier(s) S230 can function to remove one or more impurities from the silica and reaction modifier mixture from S220 and/or S240. S230 can be performed in any manner as described in S210 and/or in any manner.

Comminuting the silica S240 functions to modify the size and/or size distribution of the silica and/or the reaction modifier(s). S240 can additionally or alternatively function to mix the silica and reaction modifier, separate secondary and/or tertiary particles (e.g., defined in a similar manner as that for silicon above) of the silica into primary silica particles, and/or perform any suitable function. S240 can be performed before, during, and/or after S210, S220, and/or S230. In an illustrative example, S240 can be performed after the silica has been exposed to salt, for instance, to comminute both the silica and the salt. In a second illustrative example, S240 can be performed before the silica has been exposed to a reducing agent. However, S240 can be performed at any time relative to S220. Examples of comminuting the silica include: grinding, cutting, crushing, vibrating, milling, and/or other processes to modify the size of the silica and/or reaction modifier.

Variants of S240 can include ball milling (e.g., Rod mill, isamill, planetary ball mill, etc.), grinding, crushing (e.g., AG mil, SAG mill, Pebble mill, etc.), sonicating, stamp milling, using an arrastra, and/or other milling techniques. In an illustrative example, the silica can be ball milled with a bead size between about 0.25 mm and about 20 mm for a duration between about 1 and 12 hours at a speed between about 100 and 600 rpm. However, the silica can be ball milled with a bead size less than 0.25 mm or greater than a bead size greater than 20 mm; the silica can be ball milled for a duration less than 1 hour or greater than 12 hours; and/or the silica can be ball milled at a speed less than 100 rpm or greater than 600 rpm. In a second illustrative example, the silica (with or without reaction modifiers) can be sonicated (e.g., using an ultrasonic bath, a horn sonicator, etc.) with a sonication power between about 1 and 3000 W. The second illustrative example can provide the benefit of homogeneously dispersing the silica and/or breaking aggregates (e.g., clusters, agglomers, etc.) in the silica starting material. However, S240 can include any suitable process(es).

Reducing the silica functions S250 functions to reduce the silica to silicon. S250 can additionally or alternatively function to oxidize and/or reduce a reaction modifier (e.g., reducing a polymer to form carbon), other components of the starting material (e.g., impurities, additives, etc.), and/or perform another function. The resultant silicon preferably substantially retains a morphology of the silica and/or starting material (e.g., the silicon has substantially the same dimensions, sphericity, roundness, porosity, etc. as the silica), but can alternatively have a different morphology (e.g., adjacent particles merged into an interconnected network; different porosity; etc.), or be otherwise related.

In variants where silica and a reaction modifier are reduced, the reducing conditions are preferably the same to reduce the silica and reaction modifier, but the reducing conditions can be different to reduce the silica and the reaction modifier. The silica is preferably reduced in the presence of a reducing agent, but can be reduced without a reducing agent. S250 can include reducing purified silica (e.g., from S210 or S230), unpurified silica, silica exposed to salt(s), silica exposed to reducing agent(s), silica starting material, and/or any suitable silica. In variants of the method 20 including S220, S250 is preferably performed after S220 (e.g., after S230 or S240), but can be performed at the same time as S220. S250 is preferably performed in a reaction vessel, but can be performed in any suitable container and/or exposed to ambient environment.

The reduction can go to any degree of completion (e.g., fraction of initial silica material converted to silicon) between about 50% and 100% such as 60%, 70%, 75%, 80%, 85%, 90%, 95%, 97.5%, 98%, 99%, 99.5%, 99.9%, or 99.99%. However, the degree of completion can be less than 50%. A residual oxygen content (e.g., such as molar content, mass content, volume content, etc.; as $SiO_x$; as free oxygen; as an oxide byproduct such as MgO, $Na_2O$, etc.; etc.) can be between 0% and 50%. However, the residual oxygen content can be greater than 50%. The silicon yield (e.g., mass percentage) can be between 5% and 80% (e.g., between 9% and 79.4%, 17% and 58.2%, 23% and 46.7%., etc.). However, the silicon yield can be less than 5% or greater than 80%.

During the reduction, the environment proximal the silica is preferably inert (e.g., the environment within the reaction vessel is inert, a gas curtain adjacent the silica maintains an inert atmosphere, etc.). Examples of inert atmospheres include nitrogen, carbon dioxide, helium, neon, argon, krypton, xenon, radon, combinations thereof, a vacuum environment (e.g., a v pressure less than about 1 atm such as $10^{-10}$ mBar, $10^{-9}$ mBar, $10^{-8}$ mBar, $10^{-7}$ mBar, $10^{-6}$ mBar, $10^{-5}$ mBar, $10^{-4}$ mBar, $10^{-3}$ mBar, $10^{-2}$ mBar, $10^{-1}$ mBar, 1 mBar, 10 mBar, 100 mBar, 1000 mBar, etc.), and/or any suitable inert gases or environments. However, the environment can additionally or alternatively be a reducing environment (e.g., include reducing gases such as hydrogen, sulphur dioxide, carbon monoxide, diborane, vaporized metals, etc.), an oxidizing environment (e.g., include one or more oxidizing agents such as to regenerate one or more reducing agents), and/or have any suitable atmosphere.

The pressure within the reaction vessel can be less than atmospheric pressure (e.g., less than 1 atm such as $10^{-10}$ mBar, $10^{-9}$ mBar, $10^{-8}$ mBar, $10^{-7}$ mBar, $10^{-6}$ mBar, $10^{-5}$ mBar, $10^{-4}$ mBar, $10^{-3}$ mBar, $10^{-2}$ mBar, $10^{-1}$ mBar, 1 mBar, 10 mBar, 100 mBar, 1000 mBar, etc.), greater than atmospheric pressure (e.g., greater than 1 atm such as 3000 mBar, 5000 mBar, 10 Bar, 30 Bar, 50 Bar, 100 Bar, 300 Bar, 500 Bar, 1000 Bar, etc.), and/or equal to atmospheric pressure. In some variants, the pressure can be cycled and/or changed. In these variants, the pressure can gradually (e.g., continuously, semicontinuously) and/or suddenly (e.g., discontinuously) change. For example, the pressure can start above atmospheric pressure (e.g., have one or more gas introduced) and as the reduction proceeds be dropped below atmospheric pressure (e.g., by pulling a vacuum) or vice versa. In another example, the release of gaseous products can cause a change in the pressure within the reaction vessel. However, the pressure in the reaction vessel can be any suitable pressure.

In some variants, the pressure can include a pressure of reducing agents (e.g., magnesium vapor, aluminium vapor, etc.), wherein the reducing agents are provided in gaseous form. In these variants, the reducing agent pressure is preferably between about 0.001 to 0.1 mBar (e.g., 0.002 mBar, 0.005 mBar, 0.007 mBar, 0.0.01 mBar. 0.02 mBar, 0.05 mBar, 0.07 mBar, etc.). However, the reducing agent pressure can be less than 0.001 mBar and/or greater than 0.1 mBar. The reducing agent pressure can depend on the total pressure, the temperature, the reaction vessel design, and/or any suitable parameters. In these variants, the silica mixture being reduced can exclude or include reducing agents.

The reducing conditions and/or reducing environment are preferably maintained for between about 0.5 hours and 24 hours (e.g., 1 hour, 1.5 hours, 2 hours, 3 hours, 4 hours, 5 hours, 6 hours, 7 hours, 8 hours, 9 hours, 10 hours, 12 hours, 15 hours, 18 hours, 20 hours, 22 hours, etc.), but can be maintain for less than 0.5 hours or longer than 24 hours.

In a preferred embodiment, reducing the silica preferably includes heating the silica. However, reducing the silica can additionally or alternatively include: electrolytic reduction (e.g., applying a threshold electrical voltage), chemical reduction (e.g., addition of an acid, base, reducing agent, catalyst, etc. to promote or drive the reduction), a change in the pressure, illuminating the silica (e.g., performing a photo-driven reaction), and/or otherwise reducing the silica. Heating the silica can include annealing or sintering silica or silicon particles (e.g., primary particles, secondary particles, tertiary particles) to form interconnected structures and/or any suitable steps.

The silica can be heated using thermal elements, infrared elements, laser heating, and/or any suitable heating source. The heat can be transferred to the silica conductively, convectively, and/or radiatively.

The silica is preferably heated to at least a reducing temperature. However, the silica can be heated to a temperature below the reducing temperature (e.g., to drive a second reaction to release heat to drive the reduction, to control the reduction kinetics, etc.) and/or to any suitable temperature. The reducing temperature is preferably between about 300° C. and 1200° C. (e.g., 400° C., 500° C., 600° C., 650° C., 700° C., 750° C., 800° C., 850° C., 900° C., 1000° C., 1100° C., 1200° C., etc.). However, the reducing temperature can be less than 600° C. or greater than 1200° C. In an illustrative example, a lower temperature (e.g., 300-500° C.) can be beneficial for slowing the reaction rate and avoiding local heating effects. This lower temperature can refer to an initial treatment step and can be maintained for between about 1-6 hours and/or for any suitable amount of time. After the initial treatment step, the reaction temperature can be increase to a final reduction temperature (e.g., 600-1000° C.), where the final reduction temperature can be maintained for between 1-18 hours and/or any suitable amount of time. The ramp rate to the initial treatment step and the final reduction temperature can be the same or different. However, the reduction can be performed at a single temperature, in more steps, and/or in any manner.

The silica is preferably heated substantially uniformly (e.g., without producing hot spots; the temperature throughout the reaction vessel is maintained within ±1° C., ±5° C., ±10° C., ±20° C., ±50° C., etc. of a target temperature such as the reducing temperature; temperature difference or gradient of less than about 1° C., 2° C., 5° C., 10° C., 20° C., 50° C., 100° C., 200° C., etc. between any two locations within the reaction vessel; etc.). However, the silica can be heated nonuniformly (e.g., patterned heating, uncontrolled heating, etc.). In some variants, the uniformity of heating can depend on the morphology of the reactants. For example, using spherical silica and interconnected silica (e.g., silica with a worm-like morphology) can result in different hot spots and/or local heating effects which can impact the resulting silicon structure. However, the uniformity of the heating can be independent of the reactant morphology.

In a first variant, the inclusion of salt within the reducing environment (e.g., mixed with the silica, coating the silica, etc.) can promote more uniform heating of the silica and/or the reaction vessel, for example by decreasing reducing or slowing reducing agent diffusion proximal the silica material. In a second variant, a uniform temperature profile can be enabled by slowly ramping the temperature of the reaction vessel. For example, the ramp rate is preferably between about 0.01° C./min and 10° C./min (e.g., 0.01° C./min, 0.1° C./min, 0.5° C./min, 1° C./min, 5° C./min, 10° C./min, etc.). However, the ramp rate can be greater than 1° C./min (e.g., 20° C./min, 25° C./min, 30° C./min, 50° C./min, 100° C./min, etc.), be within a range thereof, and/or less than 0.01° C./min. In an example of the second variant, the ramp rate can vary (e.g., across time, across ramping steps, etc.). For example, a fast ramp rate can be used to initially heat the sample (e.g., until the sample reaches a temperature threshold) and a slower ramp rate can be used when the sample is above the temperature threshold (e.g., until the sample reaches the reducing temperature). However, the ramp rate can be constant and/or follow any ramp rate curve. In a third variant, planarizing and/or otherwise ensuring a substantially uniform silica thickness and/or ensuring that the silica thickness does not exceed a threshold thickness can promote uniform heating of the sample. In a fourth variant, the relative ratio of silica to reaction modifiers (e.g., salts, reducing agents) can promote uniform heating and/or otherwise influence the reduction of the silica. In a first embodiment of the fourth variant, a size and/or size distribution of the reaction modifiers can promote uniformity of the temperature (and/or otherwise influence the silica reduction). In a fifth variant, the reaction vessel can include one or more radiators or insulators arranged to control a thermal profile within the reaction vessel. In a sixth variant, a mixture of reducing agents can be provided to help control and/or limit the presence of hot spots. In an embodiment of the sixth variant, the reducing agent can include magnesium and aluminium. The ratio of magnesium to aluminium can be determined based on a target reducing time, a target temperature, a target uniformity, and/or otherwise be determined. Examples of ratios of magnesium to aluminium include 10:1, 5:1, 4:1, 2:1, 1.1:1, 1:1, 0.9:1, 0.75:1, 0.5:1, 0.2:1, 0.1:1, any ratio therebetween, greater than 10:1, or less than 0.1:1. In a seventh variant, heating the silica can include any combination of the preceding six variants to promote uniform heating. Similarly, any combination of the as described, converse, inverse, or contrapositive situations for the preceding seven variants can be used to promote and/or control a nonuniform temperature profile within the reaction vessel.

In an illustrative example, when a characteristic size (or size distribution) of the silica and/or reactants is small, when the silica has a large surface area, and/or the silica is aggregated, heating the silica and/or reactants can leads to local hot spots within the reaction environment and/or the silica. The localized hot spots can cause melting proximal to the hot spots leading to nonuniform and/or sponge-like (e.g., interconnected) structures. However, a nonuniform and/or sponge-like structure can be otherwise obtained and/or localized hot spots can otherwise impact the resulting silicon structure.

Purifying the silicon S260 preferably functions to purify the silicon generated in S250. S260 can additionally or alternatively function to remove residual (e.g., unreacted) silica; change a particle size (e.g., characteristic size of a primary, secondary, and/or tertiary particle of silicon); remove residual salts, residual reducing agents, and/or byproducts of the reduction; and/or otherwise function. S260 be performed in any manner as described in S210 or S230 and/or in any manner. In a first specific example of S260, the silicon can be washed with HCl (e.g., 1-12 M HCl), which can have the benefit of removing residual salts and/or other byproducts (e.g., Mg, MgSi, salt, MgO, etc.) from the reduction. In variants of the first example, the salts and/or byproducts can be collected, for example to reuse in step S220 (e.g., with or without further processing and/or purification). However, the salts and/or byproducts can be disposed of and/or otherwise used. In a second specific example, the silicon can be washed with HF (e.g., 2-20% HF solution in water), which can have the benefit of removing unreacted or partially reacted silica. The second specific example can have the added benefit of reducing a particle size of the silicon.

Coating the silicon S270 functions to provide one or more coatings on the silicon (e.g., from S250 or S260). S270 can additionally or alternatively include loading the silicon (e.g., loading the pores of the silicon material). The coating(s) preferably coat the secondary and/or tertiary particles of silicon (e.g., without directly coating every primary particle), but can additionally or alternatively coat the primary silicon particles. The silicon can be coated in the same reaction vessel as the reduction occurs in and/or in a different reaction vessel. The silicon can be coated immediately after formation (e.g., immediately upon completion of S250, as silicon is formed during S250, etc.) and/or any time after the silicon is formed.

The coating process preferably occurs at a coating temperature. The coating temperature can refer to an autocombustion temperature of a material (e.g., a coating precursor), a dehydration temperature, a system operation temperature, a vaporization temperature, a melting temperature, and/or any suitable temperature that promotes coating the silicon sample. The coating temperature can be between about 0° C. and 1400° C. (e.g., 0° C., 20° C., 50° C., 80° C., 100° C., 150° C., 200° C., 300° C., 400° C., 500° C., 600° C., 700° C., 800° C., 900° C., 1000° C., 1100° C., 1200° C., 1300° C., etc.). However, the coating temperature can be less than 0° C. or greater than 1400° C.

The coating process is preferably performed for a predetermined time duration. The coating time duration is preferably between 5 and 120 minutes, but can be less than 5 minutes or greater than 120 minutes. In some variants, the coating process proceeds until a predetermined coating parameter (e.g., coating thickness, coating mechanical property, coating electrical property, lithium diffusion, coating to silicon ratio, coating composition, etc.) is achieved. In these variants, the predetermined coating parameter can be monitored. Once the predetermined coating parameter is achieved, the coating process can be stopped. In a specific example, the target coating thickness can be between about 3 and 5 nm. However, the coating process can proceed for any amount of time.

S270 can include coating the silicon using one or more of: chemical vapor deposition (CVD), sputter coating, atomic layer deposition, polymerization, carbonization, mixing, growth, precursor reduction, chemical or physical interactions, and/or other coating methods can be used. The coating process preferably maintains a concentration and/or quantity of reagents (e.g., carbon source, lithium source, oxidizing agent, etc.) to maintain a predetermined or target coating parameter. Examples of coating parameters include coating to silicon ratio, coating thickness, coating uniformity, coating material, electrical conductivity, mechanical properties, and/or any suitable coating parameters. For example, the target carbon to silicon ratio, for a carbonaceous coating, is preferably about 1:8, but can be any ratio. The predetermined or target coating parameter can be controlled and/or monitored using a closed feedback loop (e.g., a coating sensor, such as a carbon sensor, can measure the coating parameter(s) as the silicon material is coated and update the coating process to achieve the target coating parameter), based on a predetermined recipe (e.g., a known procedure for preparing a target coating parameter), based on a user input, and/or otherwise control and/or monitor that the target coating parameter is achieved.

In some variants, S270 can include reducing an additive and/or additive precursor (e.g., during S250, separately from S250, before S250, after S250) to coat and/or load the silicon. In an illustrative example, when the silica is exposed to a carbon source (such as a polymer), the polymer can be reduced substantially simultaneously with the silica reduction (e.g., at any time or timing during S250; before during or after the silica reduction reaction; etc.).

Figure 9A:
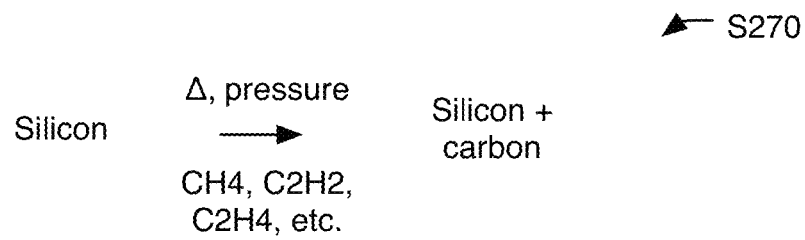
FIGS. 9A, 9B, and 9C are schematic representations of examples of coating a silicon material.

In a first variant as shown for example in FIG. 9A, S270 can include growing a carbonaceous coating using CVD with a gas phase carbon source such as methane, ethane, ethene, ethyne and/or any suitable carbon source. In an illustrative example of the first variant, the silicon heated to between about 700° C. and 950° C. under argon with a flow rate between 50 standard cubic centimeters per minute (SCCM)-500 SCCM and hydrogen (H2) with a flow rate between 20 SCCM-100 SCCM. The pressure can be maintained between about 300-700 torr. The silicon can then be heated above 900° C. and $C_2H_2$ or $CH_4$ at flow rate between 20 SCCM-200 SCCM can be introduced for between 5 minutes and 2 hours to carbon coat (or carbon load) the silicon. However, a carbon coating can be otherwise formed using a CVD process.

Figure 9B:
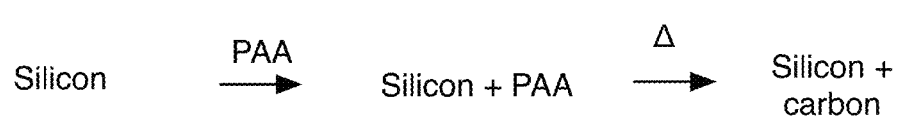

In a second variant as shown for example in FIG. 9B, S270 can include depositing and/or forming polymer on the silicon (e.g., silicon surface). The polymer is preferably a conductive polymer, but can be any suitable polymer. In some variations of this variant, the polymer can be partially or fully carbonized (e.g., by heating the polymer to a predetermined temperature such as a polymer degradation temperature).

In a third variant, S270 can include combining (e.g., mixing, depositing, etc.) a growth catalyst (e.g., iron chloride, cobalt, molybdenum, iron, iron chloride, etc.) with the silicon and growing a carbon coating on the silicon (e.g., mediated by and/or collocated with the growth catalyst). These variants can have the benefit of providing controlled structures (e.g., nanostructures, mesostructures, microstructures, macrostructures, etc.) to the coating (e.g., regions with varying thickness, electrical properties, mechanical properties, lithium diffusion, etc.).

Figure 9C:
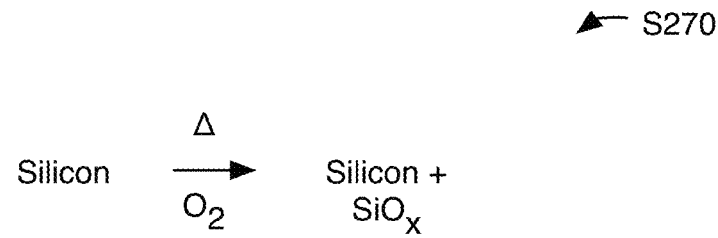

In a fourth variant as shown for example in FIG. 9C, S270 can include partially oxidizing the silicon to generate a coating of SiOx on the outer surface (e.g., environmentally exposed surface) of the silicon. The silicon can be oxidized by introducing an oxidizing agent (e.g., $O_2$) and heating the silicon. However, the silicon can be otherwise oxidized. The extent of oxidation (e.g., coating thickness, oxide formed such as value of x, oxide gradient, etc.) can be determined based on the temperature, the oxidizing agent, the concentration or partial pressure of oxidizing agent, a reaction time, and/or can be otherwise controlled.

In a fifth variant, S270 can include exposing the silicon to one or more carbon source and/or lithium source and reacting the carbon and/or lithium source(s) with an acid (e.g., HCl, Hf, etc.) at the silicon. Examples of carbon sources include alcohols, saccharides (e.g., glucose, sucrose, fructose, galactose, lactose, etc.), monomers (e.g., aniline), polymers (e.g., PE, PP, PET, phenolic resin, etc.), combinations thereof, and/or any suitable carbon source (e.g., organic or inorganic carbon source). Examples of lithium sources include: Li metal, LiGH, $LiNO_3$, LiCl, LiF, LiBr, LiI, $Li_2CO_3$, $LiHCO_3$, lithium silicates (e.g., $Li_2Si_2O_5$, $Li_2SiO_3$, $Li_2SiO_4$, etc.), combinations thereof, and/or any suitable lithium salts.

In a sixth variant, two or more coating can be formed by performing any combination of the first through fifth variants of S270 (including repeating the same variant with the same or different conditions).

However, S270 can include any suitable steps.

Post-processing the silicon for use S280 preferably functions to prepare the silicon for use in an application, for shipping, for further reactions, and/or otherwise prepare the silicon. S280 is preferably performed after S270, but can be performed before or during S270 and/or at any suitable time. Examples of S280 can include: forming a slurry of the silicon material (e.g., by mixing the silicon material with a solvent such as water to a predetermined concentration), adding one or more additive (e.g., binder, electrolyte, etc.), packaging the silicon material, comminuting the silicon (e.g., in a manner analogous to that in S240), and/or any suitable post processing steps.

5. Specific Examples

In a first specific example, a porous silicon material can include nonporous primary structures with a characteristic size between about 2 nm and about 150 nm, secondary structures with a characteristic size between about 100 and 1000 nm, and tertiary structures with a characteristic size between about 2 micrometer (μm) and 50 μm.

In a variant of the first specific example, the primary structures can be interconnected (e.g., the secondary structures can include interconnected primary structures). In a second variant of the first specific example, the primary structures can be free standing (e.g., the secondary structures can include freestanding primary structures).

In a second specific example, a porous silicon material can include nonporous primary structures with a characteristic size between about 2 nm and about 150 nm, secondary structures with a characteristic size between about 100 and 1000 nm, and tertiary structures with a characteristic size between about 2 micrometer (μm) and 50 μm; where at least one of the secondary structures and the tertiary structures is coated with a carbonaceous material (e.g., amorphous carbon, conductive carbon, polymer, etc.).

In a third specific example, a porous silicon material can include nonporous primary structures with a characteristic size between about 2 nm and about 150 nm, secondary structures with a characteristic size between about 100 and 1000 nm, and tertiary structures with a characteristic size between about 2 micrometer (μm) and 50 μm; where between 1 and 80% of the pore volume is loaded with carbon.

In a fourth specific example, a porous silicon material can include a silicon dioxide and/or lithium coating.

In a fifth specific example, a porous silicon material can include porous primary structures with a characteristic size between about 1 nm and about 500 nm. The porous silicon material can include secondary structures of aggregates of the primary structures.

In a variant of the fifth specific example, the primary structures can be free standing. In a second variant of the fifth specific example, the primary structures can be interconnected.

In a sixth specific example, a porous silicon material can include porous primary structures with a characteristic size between about 1 nm and about 500 nm. The porous silicon material can include secondary structures of aggregates of the primary structures. The porous silicon material can include a coating (e.g., carbon coating, polymer coating, silica coating, lithium coating, etc.) where the coating does not enter the pores.

In a seventh specific example, a porous silicon material can include porous primary structures with a characteristic size between about 1 nm and about 500 nm. The porous silicon material can include secondary structures of aggregates of the primary structures. The porous silicon material can include a coating (e.g., carbon coating, polymer coating, silica coating, lithium coating, etc.) where the coating enters the pores.

In an eighth specific example, the porous silicon material can have a porosity between 30 and 99%, an average pore size between 0.5 nanometers (nm) and 200 nm, a surface area between 0.02 and 1500 m²/g, a percent oxygen content by mass between about 3% and 37%, and an external volume expansion that is at most 40%.

In a ninth specific example, a porous silicon material can include porous primary structures with a characteristic size between about 10 nm and about 500 nm, where a pore diameter (e.g., average pore diameter) of the porous primary structures is between about 2 and 20 nm. The porous primary structures can be aggregated into secondary structures (e.g., clusters with a characteristic size between about 100 and 1000 nm) and/or tertiary structures (e.g., aggregates with a characteristic size between about 2 micrometer pm and 50 μm). The porous silicon material can include a second pore distribution defined between the primary structures within secondary or tertiary structures, where an average pore size for the second distribution can be between about 0.5 and 200 nm.

In a variant of the ninth specific example, the primary structures can be interconnected (e.g., the secondary structures can include interconnected primary structures). In a second variant of the first specific example, the primary structures can be free standing (e.g., the secondary structures can include freestanding primary structures).

In a first specific example, the method of manufacture can include reducing a silica starting material (e.g., unpurified silica starting material, fumed silica, silica fumes, silica gel, recycled silica starting material, waste silica, etc.) in the presence of a metal reducing agent to prepare a porous silicon material.

In a second specific example, the method of manufacture can include coating a silica starting material with a salt (e.g., NaCl) and reducing the unpurified silica starting material (e.g., the material within the coating) in the presence of a metal reducing agent to prepare a porous silicon material.

In a third specific example, the method of manufacture can include reducing a silica starting material in the presence of a metal reducing agent to prepare a porous silicon material and washing the resulting silicon with an acidic solution comprising hydrofluoric acid.

In a fourth specific example, the method of manufacture can include coating a silica starting material with a salt (e.g., NaCl), reducing the silica starting material (e.g., the material within the coating) in the presence of a metal reducing agent to prepare a porous silicon material, and washing the resulting silicon with an acidic solution comprising hydrofluoric acid.

In a fifth specific example, the method of manufacture can include reducing a silica starting material in the presence of a metal reducing agent to prepare a porous silicon material and coating the porous silicon material (e.g., with a carbonaceous coating).

In a sixth specific example, the method of manufacture can include coating a silica starting material with a salt (e.g., NaCl), reducing the silica starting material (e.g., the material within the coating) in the presence of a metal reducing agent to prepare a porous silicon material, and coating the porous silicon material (e.g., with a carbonaceous coating).

In a seventh specific example, the method of manufacture can include reducing a silica starting material in the presence of a metal reducing agent to prepare a porous silicon material, washing the resulting silicon with an acidic solution (e.g., including hydrofluoric acid), and coating the washed silicon (e.g., with a carbonaceous coating).

In an eighth specific example, the method of manufacture can include coating a silica starting material with a salt (e.g., NaCl), reducing the silica starting material (e.g., the material within the coating) in the presence of a metal reducing agent to prepare a porous silicon material, washing the resulting silicon with an acidic solution (e.g., including hydrofluoric acid), and coating the washed silicon material (e.g., with a carbonaceous coating).

In a ninth specific example, the method of manufacture can include exposing (e.g., coating) a silica starting material with a carbon source (e.g., a polymer), reducing the silica starting material and the carbon source in the presence of a metal reducing agent to prepare a porous silicon material with a carbonaceous coating. The carbon coated silicon can optionally be washed with an acidic solution (e.g., including hydrofluoric acid).

In a tenth specific example, the method of manufacture can include exposing (e.g., coating) a silica starting material with a carbon source (e.g., a polymer), reducing the silica starting material in the presence of a metal reducing agent to prepare a porous silicon material with a carbon coating. In this specific example, the carbon source can be reduced, be partially reduced, and/or not be reduced. This specific example can optionally include washing the carbon coated silica (e.g., with an acidic solution) which could reduce the carbon source (e.g., convert the carbon source to carbon).

In an eleventh specific example, the method of manufacture can include reducing fumed silica in the presence of a metal reducing agent to prepare a porous silicon material.

In an eleventh specific example, the method of manufacture can include reducing silica gel in the presence of a metal reducing agent to prepare a porous silicon material.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A method for manufacturing a porous silicon material comprising:
    reducing a fumed silica in a presence of a metal reducing agent to obtain the porous silicon material comprising of an interconnected network of silicon nanoparticles,
    wherein a size of the silicon nanoparticles is between about 2 nanometers (nm) and 500 nm,
    wherein the metal reducing agent is at least one selected from the group consisting of magnesium and aluminum,
    wherein reducing the fumed silica in the presence of the metal reducing agent comprises:
    heating the fumed silica to an initial treatment at a temperature between 300-500° C. for 1-6 hours; and
    further heating the fumed silica to a final reducing temperature between 600 and 1000° C. for 1-18 hours.

2. The method of claim 1, further comprising exposing the fumed silica with a salt before reducing the fumed silica in the presence of the metal reducing agent.

3. The method of claim 1, further comprising coating the fumed silica with a salt before reducing the fumed silica in the presence of the metal reducing agent.

4. The method of claim 1, wherein the silicon nanoparticles comprise a uniform particle size distribution.

5. The method of claim 1, further comprising coating the porous silicon material with a carbonaceous material.

6. The method of claim 5, comprising coating the porous silicon material with the carbonaceous material using a chemical vapor deposition.

7. The method of claim 5, wherein an internal volume filling of the carbonaceous material loading is between 1 and 80%.

8. The method of claim 1 wherein a purity percentage of the fumed silica is between 80%-95% silicon oxide.

9. The method of claim 1, wherein the porous silicon material comprises a surface area that is between 50 and 1500 $m^2/g$.

* * * * *